US008502852B2

(12) United States Patent
Numata et al.

(10) Patent No.: US 8,502,852 B2
(45) Date of Patent: Aug. 6, 2013

(54) SURFACE EMITTING LASER DEVICE, SURFACE EMITTING LASER ARRAY, OPTICAL SCANNING DEVICE, IMAGE FORMING APPARATUS, AND METHOD OF MANUFACTURING THE SURFACE EMITTING LASER DEVICE

(75) Inventors: Masayuki Numata, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 33 days.

(21) Appl. No.: 13/155,494

(22) Filed: Jun. 8, 2011

(65) Prior Publication Data

US 2011/0304684 A1 Dec. 15, 2011

(30) Foreign Application Priority Data

Jun. 11, 2010 (JP) ................................ 2010-133472
Apr. 7, 2011 (JP) ................................ 2011-084987

(51) Int. Cl.
*B41J 2/45* (2006.01)
*H01S 5/00* (2006.01)

(52) U.S. Cl.
USPC ....................................... 347/238; 372/50.11

(58) Field of Classification Search
USPC ............ 347/238; 372/44.011, 50.11, 50.124, 372/43.01, 45.01, 45.011; 348/38; 257/13, 257/14, 23, 25
See application file for complete search history.

(56) References Cited

U.S. PATENT DOCUMENTS

| | | |
|---|---|---|
| 5,923,691 A | 7/1999 | Sato |
| 5,939,733 A | 8/1999 | Sato |
| 6,002,700 A | 12/1999 | Sato |
| 6,072,196 A | 6/2000 | Sato |
| 6,201,264 B1 | 3/2001 | Khare et al. |
| 6,207,973 B1 | 3/2001 | Sato et al. |
| 6,233,264 B1 | 5/2001 | Sato et al. |
| 6,542,528 B1 | 4/2003 | Sato et al. |
| 6,563,851 B1 | 5/2003 | Jikutani et al. |
| 6,614,821 B1 | 9/2003 | Jikutani et al. |
| 6,674,777 B1 | 1/2004 | Nohava et al. |
| 6,674,785 B2 | 1/2004 | Sato et al. |
| 6,765,232 B2 | 7/2004 | Kaminishi et al. |

(Continued)

FOREIGN PATENT DOCUMENTS

| | | |
|---|---|---|
| JP | 2000-208811 | 7/2000 |
| JP | 2002-299761 | 10/2002 |

(Continued)

OTHER PUBLICATIONS

Ueki, Nobuaki, et al. (2004), "VCSEL Array Applicable to Laser Printer," Electronics Society Congress of the Institute of Electronics, Information and Communication Engineers (IEICE), CS-3-4, S-31 (with partial English Translation).

*Primary Examiner* — Hai C Pham
(74) *Attorney, Agent, or Firm* — Cooper & Dunham LLP

(57) ABSTRACT

A surface emitting laser device includes a substrate and plural semiconductor layers laminated on the substrate, the plural semiconductor layers including a first semiconductor multi-layer film including aluminum (Al), an active layer, and a second semiconductor multi-layer film, a light emitting section having a mesa structure being formed on the first semiconductor multi-layer film. When viewed in a direction orthogonal to a surface of the substrate, an outer shape of the first semiconductor multi-layer film is a macroscopically smooth shape without an angular corner, and a side surface of the first semiconductor multi-layer film is coated with a passivation film and a protection film.

15 Claims, 22 Drawing Sheets

(56) References Cited

U.S. PATENT DOCUMENTS

| | | |
|---|---|---|
| 6,803,604 B2 | 10/2004 | Takahashi et al. |
| 6,927,412 B2 | 8/2005 | Takahashi et al. |
| 6,959,025 B2 | 10/2005 | Jikutani et al. |
| 6,975,663 B2 | 12/2005 | Sekiya et al. |
| 7,235,816 B2 | 6/2007 | Takahashi et al. |
| 7,684,458 B2 | 3/2010 | Sato et al. |
| 7,693,204 B2 | 4/2010 | Sato et al. |
| 7,746,912 B2 * | 6/2010 | Motomura et al. ...... 372/50.124 |
| 2002/0142506 A1 | 10/2002 | Sato |
| 2006/0054899 A1 | 3/2006 | Takahashi et al. |
| 2007/0254393 A1 * | 11/2007 | Johnson ........................ 438/38 |
| 2008/0055672 A1 | 3/2008 | Watanabe et al. |
| 2008/0056321 A1 | 3/2008 | Motomura et al. |
| 2008/0233017 A1 | 9/2008 | Sato et al. |
| 2009/0262770 A1 * | 10/2009 | Itoh et al. ................. 372/44.011 |
| 2009/0285252 A1 | 11/2009 | Ishii et al. |
| 2009/0285602 A1 | 11/2009 | Harasaka et al. |
| 2009/0295902 A1 | 12/2009 | Sato et al. |
| 2009/0303308 A1 | 12/2009 | Itoh et al. |
| 2009/0310632 A1 | 12/2009 | Sugawara et al. |
| 2010/0034233 A1 * | 2/2010 | Suzuki et al. .............. 372/50.11 |
| 2010/0060712 A1 | 3/2010 | Sato et al. |
| 2010/0189467 A1 | 7/2010 | Sato et al. |
| 2010/0214633 A1 | 8/2010 | Sato et al. |

FOREIGN PATENT DOCUMENTS

| | | |
|---|---|---|
| JP | 2004535057 | 11/2004 |
| JP | 2007-173513 | 7/2007 |
| JP | 2008-60322 | 3/2008 |

* cited by examiner

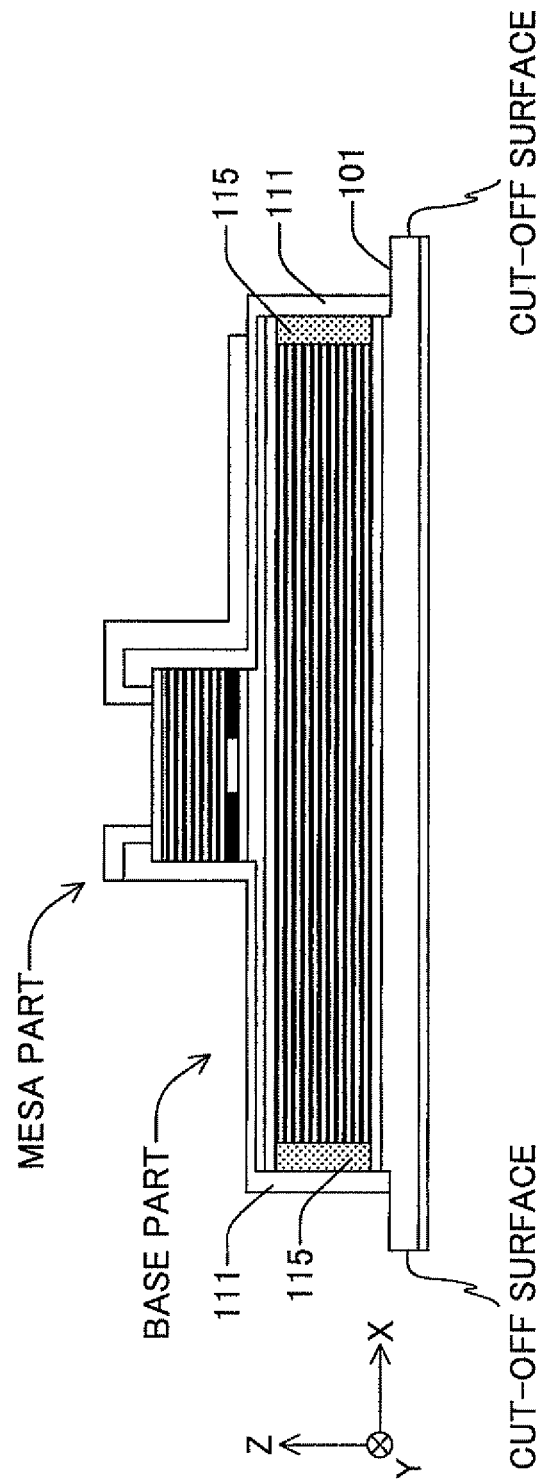

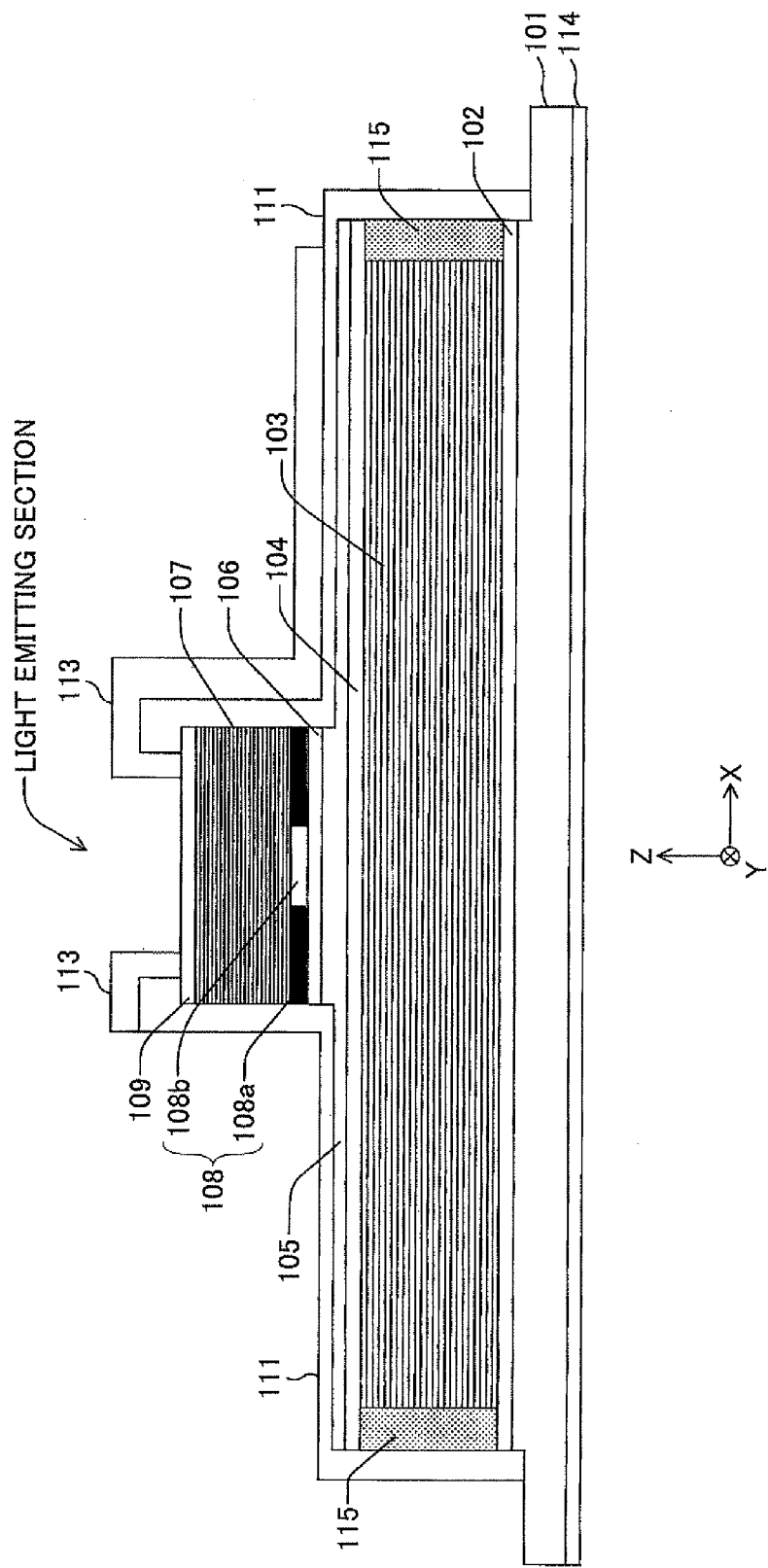

SURFACE EMITTING LASER DEVICE, SURFACE EMITTING LASER ARRAY, OPTICAL SCANNING DEVICE, IMAGE FORMING APPARATUS, AND METHOD OF MANUFACTURING THE SURFACE EMITTING LASER DEVICE

CROSS-REFERENCE TO RELATED APPLICATIONS

The present application claims priority under 35 U.S.C §119 based on Japanese Patent Application Nos. 2010-133472 filed Jun. 11, 2010 and 2011-084987 filed Apr. 7, 2011, the entire contents of which are hereby incorporated herein by reference.

BACKGROUND OF THE INVENTION

1. Field of the Invention

The present invention relates to a surface emitting laser device, a surface emitting laser array, an optical scanning device, an image forming apparatus, and a method of manufacturing the surface emitting laser device. More particularly, the present invention relates to a surface emitting laser device and a surface emitting laser array capable of emitting light in the direction orthogonal to their substrate, an optical scanning device including the surface emitting laser device or the surface emitting laser array, an image forming apparatus having the optical scanning device, and a method of manufacturing the surface emitting laser device capable of emitting light in the direction orthogonal to its substrate.

2. Description of the Related Art

A Vertical Cavity Surface Emitting Laser (hereinafter may be referred to as "VCSEL") is capable of emitting light in the direction orthogonal to its substrate. When compared with edge emitting semiconductor lasers capable of emitting light in the direction parallel to its substrate, the VCSEL may have some advantages such as lower cost, lower energy consumption, smaller size, preferable to two-dimensionally integrated devices, and higher performance. Recently, because of those advantages, the VCSEL has attracted increased attention.

The application fields of the surface emitting laser device include a light source (oscillation wavelength: 780 nm band) for an optical writing system in a printer, a writing light source (oscillation wavelength: 780 nm band and 850 nm band) in an optical disk apparatus, and a light source (oscillation wavelength: 1.3 µm band and 1.5 µm band) in a light transmission system such as an LAN (Local Area Network) using optical fibers. Further, a surface emitting laser device is expected to be used as a light source for optical transmissions between boards, within a board, between chips in a Large Scale Integrated Circuit (LSI), and within a chip in the LSI.

In those application fields, there are many demands for higher reliability and resistance to corrosion against moisture and the like.

In the surface emitting laser devices, however, a material including Al (e.g., AlGaAs) is generally used. Further, generally, plural surface emitting laser devices are simultaneously formed on a single substrate first. Then, the plural surface emitting laser devices on the substrate is cut into plural surface emitting laser devices. In this case, a cross-sectional surface of the material including Al may be exposed (see, for example, Nobuaki UEKI and four other authors, "Application of VCSEL array to a laser printer", Electronics Society Congress of the Institute of Electronics, Information and Communication Engineers (IEICE), CS-3-4, S-31, 2004, and Japanese Patent Application Publication No. 2002-299761).

When a material including Al is exposed as described above, the material including Al may react with moisture or the like. As a result, the chip including the material may be corroded and may not be functioned as a semiconductor device.

To resolve the problem, there have been proposed methods of passivating an Al-containing material that is exposed on the side surface (see, for example, Japanese Patent Application Publication Nos. 2000-208811 and 2004-535057), and there has been another method of forming a protection film on the surface of the Al-containing material that is exposed on the side surface (see, for example, Japanese Patent Application Publication No. 2007-173513).

However, after the passivation or the forming the protection film, there is, for example, a dicing process or a scribe breaking process. Due to impact during such processes, a crack may be generated in the passivation film or the protection film. As a result, sufficient reliability may be impacted.

SUMMARY OF THE INVENTION

The present invention is made in light of the above circumstances, and may provide a surface emitting laser device and a surface emitting laser array having higher reliability.

Further, the present invention may provide an optical scanning device performing stable optical scanning.

Further, the present invention may provide an image forming apparatus forming a higher-quality image.

Further, the present invention may provide a manufacturing method of manufacturing a surface emitting laser device having higher reliability.

According to an aspect of the present invention, there is provided a surface emitting laser device including a substrate and plural semiconductor layers laminated on the substrate, the plural semiconductor layers including a first semiconductor multi-layer film including aluminum (Al), an active layer, and a second semiconductor multi-layer film, a light emitting section having a mesa structure being formed on the first semiconductor multi-layer film. Further, when viewed in a direction orthogonal to a surface of the substrate, an outer shape of the first semiconductor multi-layer film is a macroscopically smooth shape without an angular corner, and a side surface of the first semiconductor multi-layer film is coated with a passivation film and a protection film.

BRIEF DESCRIPTION OF THE DRAWINGS

Other objects, features, and advantages of the present invention will become more apparent from the following description when read in conjunction with the accompanying drawings, in which:

FIG. 4 is a cross-sectional view cut along the line A-A in FIG. 3;

FIG. 5 is a drawing illustrating a configuration of the surface emitting laser device;

DETAILED DESCRIPTION OF THE PREFERRED EMBODIMENTS

Figure 1:
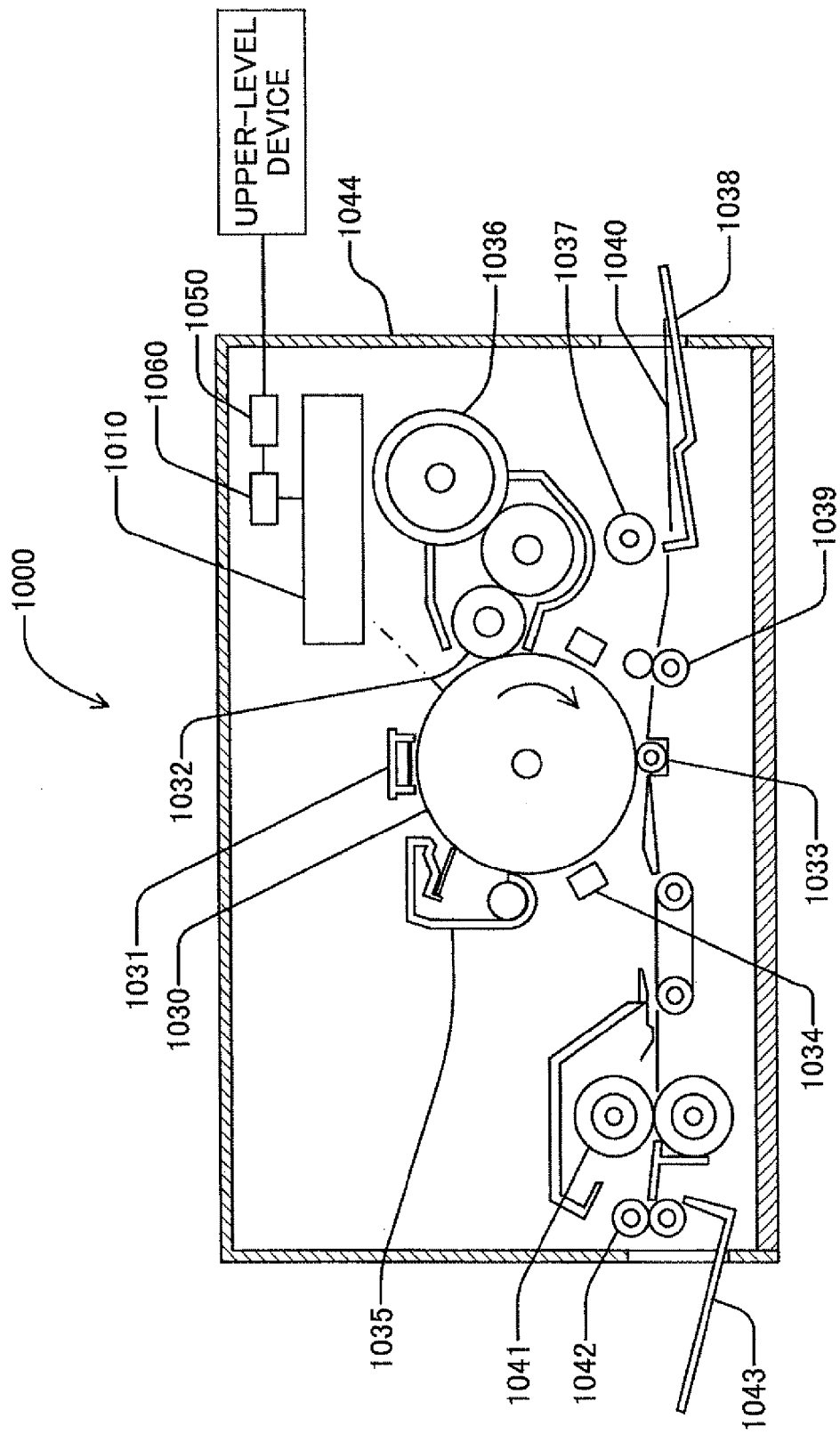
FIG. 1 is a schematic view illustrating a configuration of a laser printer according to an embodiment of the present invention.

In the following, an embodiment of the present invention is described with reference to FIGS. 1 through 10. FIG. 1 schematically illustrates a configuration of a laser printer 1000 according to an embodiment of the present invention.

As illustrated in FIG. 1, the laser printer 1000 includes an optical scanning device 1010, a photosensitive drum 1030, a charger 1031, a developing roller 1032, a transfer charger 1033, a neutralizing unit 1034, a cleaning unit 1035, a toner cartridge 1036, a sheet feeding roller 1037, a sheet feeding tray 1038, a resist roller pair 1039, a fixing roller 1041, a discharging roller 1042, a discharging tray 1043, a communication control device 1050, and a printer controlling device 1060 generally controlling the above elements. These elements are disposed at their respective positions in a printer chassis 1044.

The communication control device 1050 controls bidirectional communications with an upper-level device (such as a personal computer) through a network.

The photosensitive drum 1030 has a cylindrical shape, and a photosensitive layer is formed on the surface of the photosensitive drum 1030. Namely, the surface of the photosensitive drum 1030 is a surface to be scanned. Further, the photosensitive drum 1030 rotates in the direction indicated by the arrow (indicated in the photosensitive drum 1030) in FIG. 1.

The charger 1031, the developing roller 1032, the transfer charger 1033, the neutralizing unit 1034, and the cleaning unit 1035 are disposed in the vicinity of the surface of the photosensitive drum 1030. Further, the charger 1031, the developing roller 1032, the transfer charger 1033, the neutralizing unit 1034, and the cleaning unit 1035 are sequentially arranged in this order along the rotating direction of the photosensitive drum 1030.

The charger 1031 uniformly charges the surface of the photosensitive drum 1030.

The optical scanning device 1010 scans a light flux modulated based on image information from the upper-level device. By doing this, a latent image based on the image information is formed on the surface of the photosensitive drum 1030, the surface being charged by the charger 1031. The formed latent image is moved to the direction of the developing roller 1032 by the rotation of the photosensitive drum 1030. The configuration of the optical scanning device 1010 is described below.

The toner cartridge 1036 contains toner, and the toner is supplied to the developing roller 1032.

The developing roller 1032 causes the toner supplied from the toner cartridge 1036 to adhere onto the latent image formed on the surface of the photosensitive drum 1030 to visualize the image information. The latent image with toner adhered (hereinafter may be referred to as a "toner image" for convenience) is moved to the direction of the transfer charger 1033 by the rotation of the photosensitive drum 1030.

The sheet feeding tray 1038 stores recording sheets 1040. In the vicinity of the sheet feeding tray 1038, the sheet feeding roller 1037 is provided. The sheet feeding roller 1037 feeds the recording sheets 1040 from the sheet feeding tray 1038 to the resist roller pair 1039 one by one. The resist roller pair 1039 first holds the recording sheet 1040 taken out by the sheet feeding roller 1037, and sends out the recording sheet 1040 toward the gap between the photosensitive drum 1030 and the transfer charger 1033 in synchronization with the rotation of the photosensitive drum 1030.

A voltage having the polarity opposite to the polarity of the voltage of the toner is applied to the transfer charger 1033 to electrically attract the toner on the surface of the photosensitive drum 1030 to the recording sheet 1040. By applying the voltage, the toner image on the surface of the photosensitive drum 1030 is transferred onto the recording sheet 1040. The recording sheet 1040 with the transferred toner image is fed to the fixing roller 1041.

The fixing roller 1041 applies heat and pressure to the recording sheet 1040 to fix the toner onto the recording sheet 1040. The recording sheet 1040 with the fixed toner is discharged to the discharging tray 1043 by the discharging roller 1042 to be sequentially stacked on the discharging tray 1043.

The neutralizing unit 1034 electrically neutralizes the surface of the photosensitive drum 1030.

The cleaning unit 1035 removes the toner (residual toner) remaining on the surface of the photosensitive drum 1030. The surface of the photosensitive drum 1030 on which the residual toner has been removed is returned to the position facing the charger 1031 again.

Next, a configuration of the optical scanning device 1010 is described.

Figure 2:
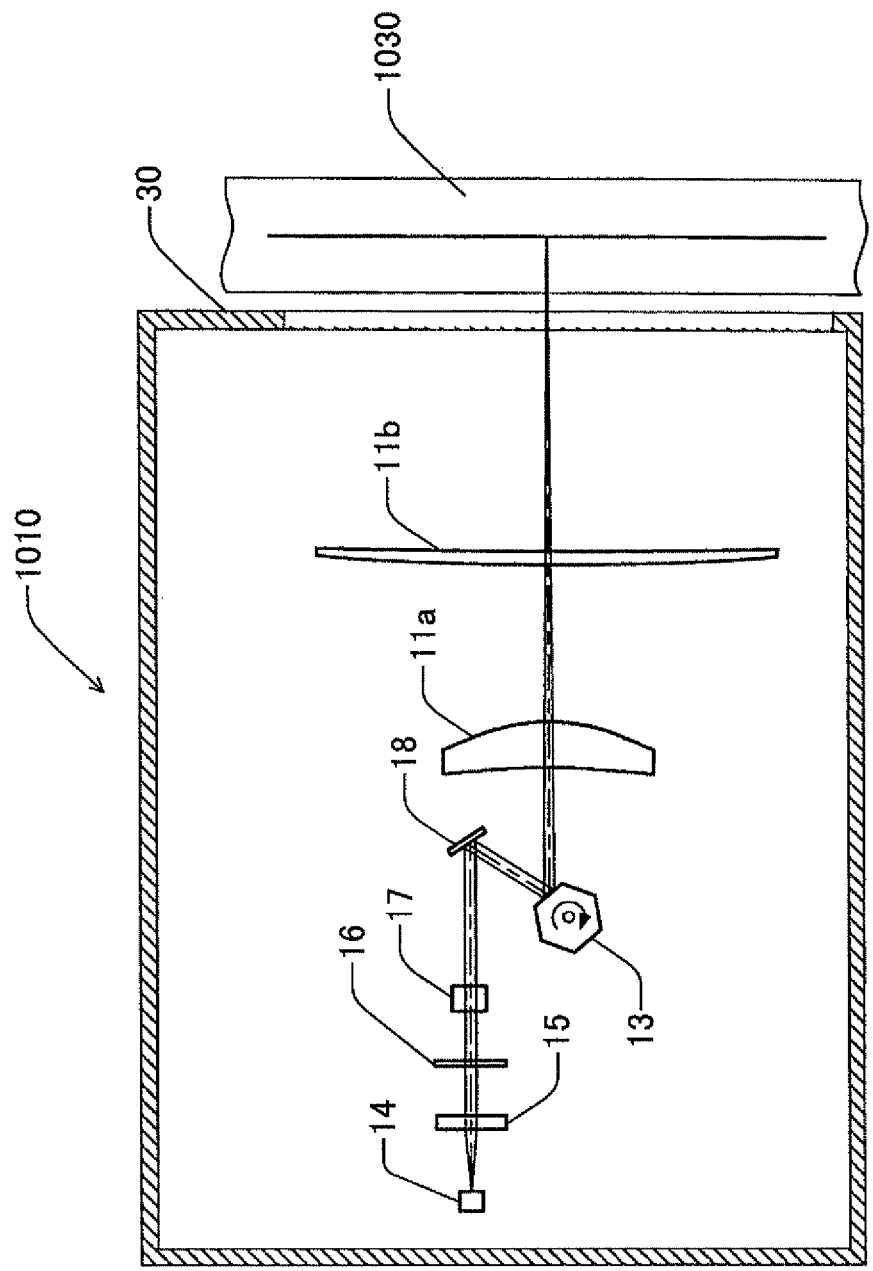
FIG. 2 is a schematic view illustrating an optical scanning device in FIG. 1.

For example, as illustrated in FIG. 2, the optical scanning device 1010 includes a deflector-side scanning lens 11a, an image-surface-side scanning lens 11b, a polygon mirror 13, a light source 14, a coupling lens 15, an aperture plate 16, a cylindrical lens 17, a reflection mirror 18, a scanning control device (not shown) and the like. These elements are disposed at their respective predetermined positions in an optical housing 30.

In the following, for convenience, the direction corresponding to a main scanning direction is simplified as a "main-scanning corresponding direction", and the direction corresponding to a sub-scanning direction is simplified as a "sub-scanning corresponding direction".

The coupling lens 15 converts the light flux output from the light source 14 into a substantially parallel light beam.

The aperture plate 16 has an opening to determine the diameter of the beam of the light flux having passed through the coupling lens 15.

The cylindrical lens 17 forms an image by refracting the light flux having passed through the opening of the aperture plate 16 in the vicinity of the deflection reflection surface of the polygon mirror 13 with respect to the sub-scanning corresponding direction via the reflection mirror 18.

The optical system disposed on the optical path between the light source 14 and the polygon mirror 13 may also be called a pre-deflector optical system. In this embodiment, the pre-deflector optical system includes the coupling lens 15, the aperture plate 16, the cylindrical lens 17, and the reflection mirror 18.

For example, the polygon mirror 13 has a hexagonal mirror surface having an inscribed circle with circle radius of 18 mm. Each of the mirrors serves as a deflection reflection surface. This polygon mirror 13 deflects the light flux from the reflection mirror 18 while rotating around an axis parallel to the sub-scanning corresponding direction.

The deflector-side scanning lens 11a is disposed on the optical path of the light flux deflected by the polygon mirror 13.

The image-surface-side scanning lens 11b is disposed on the optical path of the light flux having passed through the deflector-side scanning lens 11a. The light flux having passed through the image-surface-side scanning lens 11b is transmitted onto the surface of the photosensitive drum 1030 to form a light spot. The light spot moves in the longitudinal direction of the photosensitive drum 1030 in accordance with the rotation of the polygon mirror 13. Namely, the light spot is scanned on the surface of the photosensitive drum 1030. This moving direction of the light spot corresponds to the "main-scanning corresponding direction". Further, the rotation direction of the photosensitive drum 1030 corresponds to the "sub-scanning corresponding direction".

The optical system disposed on the optical path between the polygon mirror 13 and the photosensitive drum 1030 may also be called a scanning optical system. In this embodiment, the scanning optical system includes the deflector-side scanning lens 11a and the image-surface-side scanning lens 11b. Further, at least one folding mirror may be disposed on at least one of the optical paths between the deflector-side scanning lens 11a and the image-surface-side scanning lens 11b and between the image-surface-side scanning lens 11b and the photosensitive drum 1030.

Figure 3:
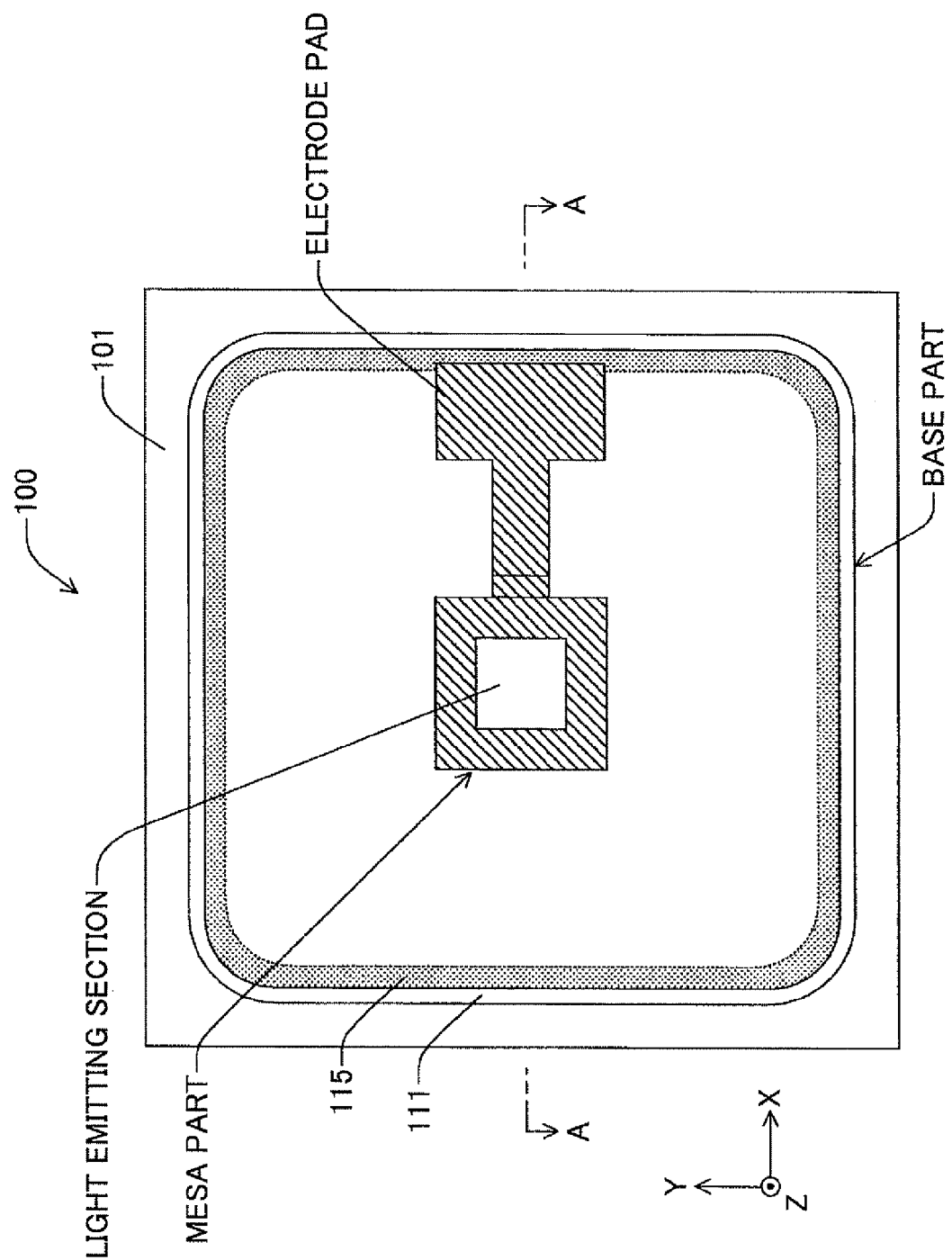
FIG. 3 is a drawing illustrating a surface emitting laser device included in a light source of FIG. 2.

For example, the light source 14 includes a surface emitting laser device 100 as illustrated in FIGS. 3 and 4. FIG. 3 is a plane view of the surface emitting laser device 100, and FIG. 4 is a cross-sectional view cut along the line A-A in FIG. 3. In those figures, a passivation film 115 is described. However, this is for explanatory purposes only, and it may not be visible when actually viewed in the direction orthogonal to the surface of the substrate. In this description, it is assumed that the Z axis direction in the figures is the direction parallel to the laser oscillation direction, and X axis direction and Y axis direction are orthogonal to each other in a plane orthogonal to the Z axis direction.

The surface emitting laser device 100 is the Vertical Cavity Surface Emitting Laser (VCSEL) having a oscillation wavelength of 780 nm band, and plural semiconductor layers are laminated on a substrate 101. The plural semiconductor layers include a mesa part (hereinafter may be simplified as "mesa" for convenience purposes) and a part disposed between the mesa part and the substrate 101. The mesa part includes a light emitting section. Hereinafter, the part between the mesa part and the substrate 101 may also be referred to as a base part for convenience purposes. In this embodiment, when viewed in the Z axis direction, the outer shape of the mesa part is rectangular, and the outer shape of the base part is rectangular having rounded corners.

As illustrated in FIG. 5 which is enlarged view of FIG. 4, the surface emitting laser device 100 includes the substrate 101, a buffer layer 102, a lower semiconductor DBR (Distribution Bragg Reflection) 103, a lower spacer layer 104, an active layer 105, an upper spacer layer 106, an upper semiconductor DBR 107, a contact layer 109, and the like.

Figure 6A:
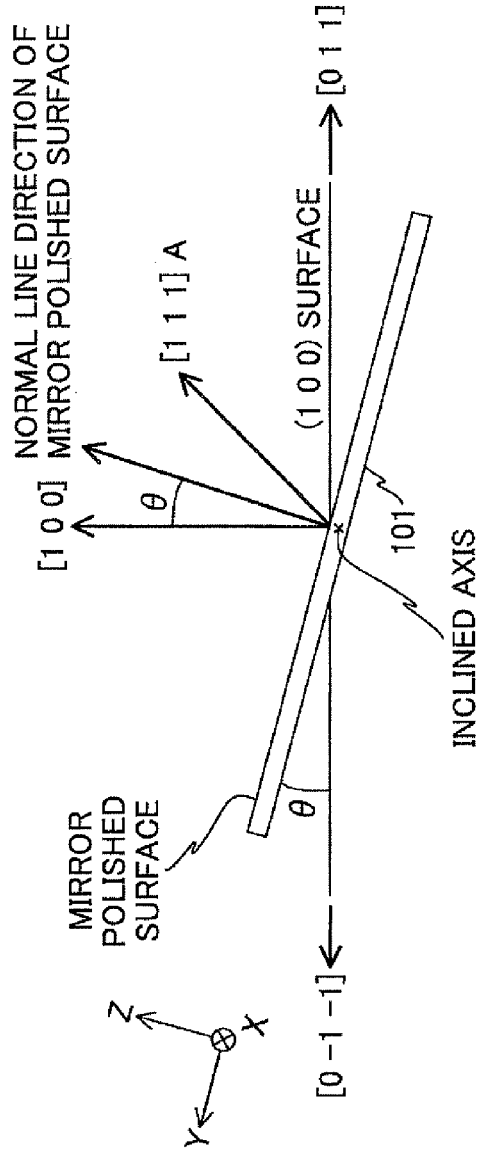
FIGS. 6A and 6B are drawings illustrating substrates of the respective surface emitting laser devices.
Figure 6B:
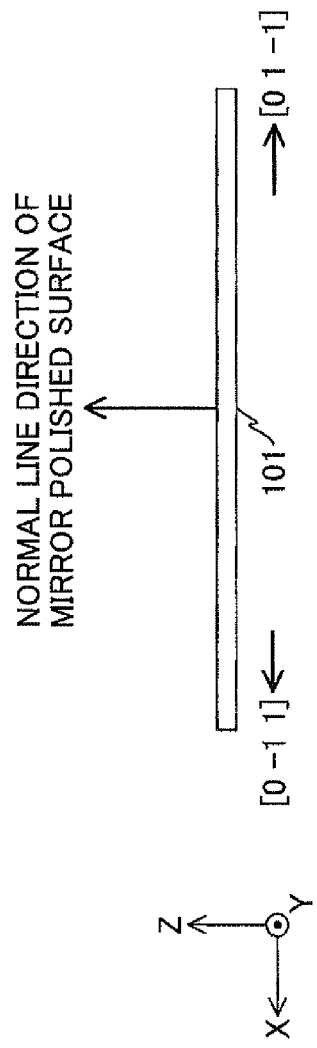

The surface of the substrate 101 is an n-GaAs single-crystal semiconductor substrate and has a mirror polished surface. Further, as illustrated in FIG. 6A, the normal direction of the mirror polished surface (main surface) of the substrate 101 is inclined relative to the crystal orientation [100] direction toward the crystal orientation [111]A direction by an angle of 15 degrees ($\theta$=15 degrees). Namely, the substrate 101 is a so-called inclined substrate. Herein, as illustrated in FIG. 6B, the substrate 101 is disposed in a manner such that the crystal orientation [0-11] direction is parallel to the +X direction and the crystal orientation [01-1] direction is parallel to the −X direction.

Referring back to FIG. 5, the buffer layer 102 is laminated on the +Z side of the substrate 101, and is made of n-GaAs.

The lower semiconductor DBR 103 includes a first lower semiconductor DBR and a second lower semiconductor DBR.

The first lower semiconductor DBR is laminated on the +Z side of the buffer layer 102, and includes 37 pairs of a low refractive index layer made of n-AlAs and a high refractive index layer made of n-Al$_{0.33}$Ga$_{0.67}$As. Further, a composition gradient layer having the thickness of 20 nm is interposed between adjacent refractive index layers to reduce the electrical resistance. In the composition gradient layer, the composition is gradually changed from one component to another component. Further, each of the refractive index layers is designed so that the optical thickness of the refractive index layer and one-half of each of the composition gradient layers adjoining the refractive index layer is equal to $\lambda$/4 ($\lambda$: oscillation wavelength). Further, there is a relationship between the optical thickness of a layer and an actual thickness of the layer, in which when the optical thickness of a layer is $\lambda$/4, the actual thickness "D" of the layer is expressed by the following formula:

$$D=\lambda/4n$$

where: the symbol "n" denotes a refractive index of the medium of the layer.

The second lower semiconductor DBR is laminated on the +Z side of the first lower semiconductor DBR, and includes three pairs of the low refractive index layer made of n-AlAs and the high refractive index layer made of n-Al$_{0.33}$Ga$_{0.67}$As. Further, each of the low refractive index layers is designed so that the optical thickness of the low refractive index layer and one-half of each of the composition gradient layers adjoining the low refractive index layer is equal to 3$\lambda$/4. Further, each of the high refractive index layers is designed so that the optical thickness of the high refractive index layer and one-half of each of the composition gradient layers adjoining the high refractive index layer is equal to $\lambda$/4.

Namely, the thickness of the low refractive index layer in the second lower semiconductor DBR is greater than the thickness of the low refractive index layer in the first lower semiconductor DBR.

Figure 7:
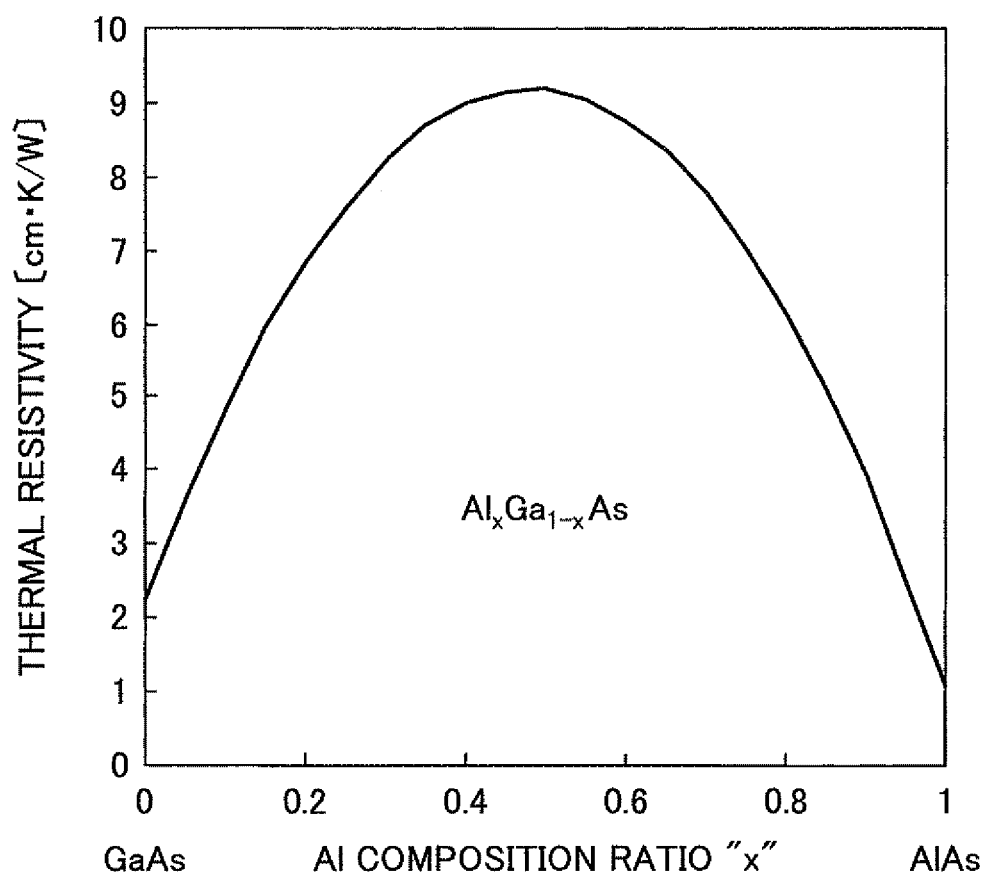
FIG. 7 is a graph illustrating relationships between a value "x" in $Al_xGa_{1-x}As$ and the corresponding thermal resistivity.

On the other hand, as illustrated in FIG. 7, the thermal resistance (thermal resistivity) of an AlAs layer is less than the thermal resistance (thermal resistivity) of an AlGaAs layer having any composition ratio (between Al and Ga). Because of this feature, by increasing the thickness of the AlAs layer near the active layer 105 which becomes a heat source, it may become possible to effectively dissipate heat. By doing in this way, effects of controlling the degradation of the device characteristics and extending the service life time of the device may be improved.

The lower spacer layer 104 is laminated on the +Z side of the lower semiconductor DBR 103, and is a layer made of non-doped $(Al_{0.1}Ga_{0.9})_{0.5}In_{0.5}P$. The optical thickness of the lower spacer layer 104 is $\lambda/4$.

The active layer 105 is laminated on the +Z side of the lower spacer layer 104, and has a triple quantum well structure made of GaInAsP/GaInP.

The upper spacer layer 106 is laminated on the +Z side of the active layer 105 and is a layer made of non-doped $(Al_{0.1}Ga_{0.9})_{0.5}In_{0.5}P$. The optical thickness of the upper spacer layer 106 is $\lambda/4$.

The part including the lower spacer layer 104, the active layer 105, and the upper spacer layer 106 may also be called a "resonant structure". The resonant structure is designed so that the optical length of the resonant structure and one-half of each of the composition gradient layers adjoining the resonant structure is equal to one wavelength. Further, the active layer 105 is disposed at the position of the middle of the "resonant structure" to obtain high stimulated (induced) emission probability, the position corresponding to an antinode position of the standing wave distribution of the electric field. Further, it is preferable that In is included in the entire area of the resonant structure. This is because when the resonant structure is made of a material including In, it may become possible to increase the difference between the etching speed of the resonant structure and the other layers not including In. By doing this, it may becomes possible to make it easier to stop etching within the resonant structure without reaching the lower semiconductor DBR when the mesa part (mesa) is to be formed in a dry etching process.

The upper semiconductor DBR 107 is laminated on the +Z side of the upper spacer layer 106, and includes 23 pairs of a low refractive index layer made of $p\text{-}Al_{0.93}Ga_{0.07}As$ and a high refractive index layer made of $p\text{-}Al_{0.31}Ga_{0.69}As$. Further, the composition gradient layer is interposed between adjacent refractive index layers. Further, each of the refractive index layers is designed so that the optical thickness of the refractive index layer and one-half of each of the composition gradient layers adjoining the refractive index layer is equal to $\lambda/4$.

In one low refractive index layer included in the upper semiconductor DBR 107, a selectively-oxidized layer 108 made of p-AlAs and having a thickness of 30 nm is interposed. The interposed position of the selectively-oxidized layer 108 corresponds to the position in the low refractive index layer of the second pair from the upper spacer layer 106.

The contact layer 109 is laminated on the +Z side of the upper semiconductor DBR 107, and is made of p-GaAs.

Further, in the following, for convenience, the structure in which the plural semiconductor layers are laminated on the substrate 101 as described above may be called a "laminated body" for convenience purposes.

Next, a method of manufacturing the surface emitting laser device 100 is described.

(1): The above laminated body is formed by crystal growth by the MOCVD (Metal Organic Chemical Vapor Deposition) method or the MBE (Molecular Beam Epitaxy) method.

Herein, as a group III material, trimethyl aluminum (TMA), trimethyl gallium (TMG), or trimethyl indium (TMI) is used. Further, as a group V material, phosphine ($PH_3$) or arsine ($AsH_3$) is used. Further, as a p-type dopant material, Carbon tetrabromide ($CBr_4$) or dimethylzinc (DMZn) is used. Further, as an n-type dopant material, hydrogen selenide ($H_2Se$) is used.

(2): On the surface of the laminated body, a resist pattern having a square shape with one side having a length of 25 μm is formed.

(3): By the ICP (Inductively Coupled Plasma) dry etching method, by using the resist pattern as a photo mask, the mesa having a square prism shape is formed. In this case, the bottom surface of the etching is disposed within the active layer 105.

(4): The photomask is removed.

(5): The laminated body with formed mesa is heat-processed with water vapor. By doing this, Al (aluminum) in the selectively-oxidized layer 108 is selectively oxidized. Then, an unoxidized region 108b that remains unoxidized and that is surrounded by an Al-oxidized layer 108a is remained (formed). By doing this, the so-called oxide-confined structure is formed so that the passage of the driving current of the light emitting section is limited to the middle region of the mesa. The unoxidized region 108b serves as the current passage region (current injection region).

(6): For the laminated body where the selective oxidation process has completed, to define the outer shape of the base part, a resist pattern having an outer shape corresponding to a rectangular shape having rounded corners is formed by lithography.

Figure 8:
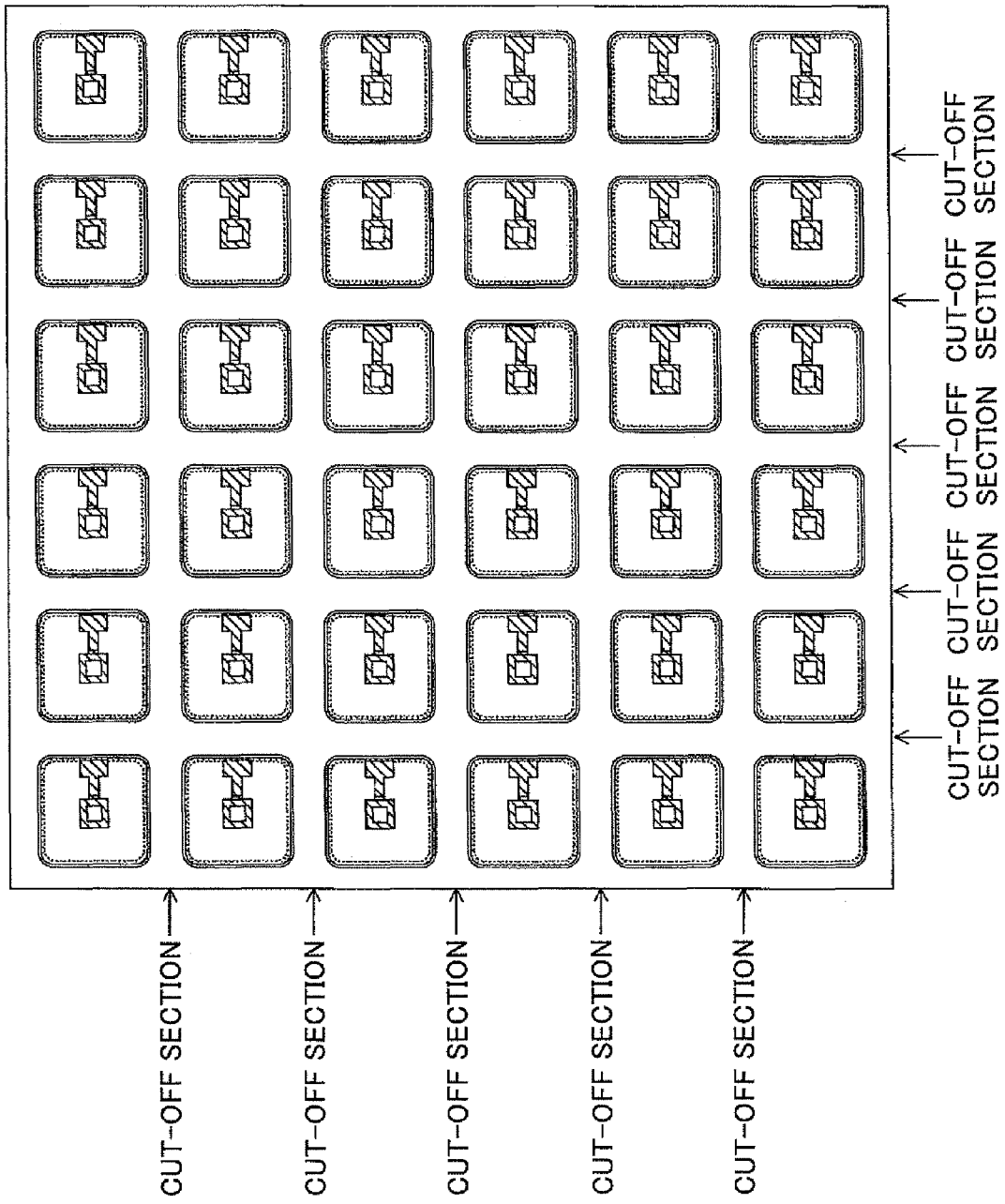
FIG. 8 is a drawing illustrating cut-off sections which are to be cut off when the substrate is cut into plural chips.

(7): By the ICP dry etching method, the base part is formed in a manner such that the bottom surface of the etching reaches the substrate made of material not including Al. The outer shape of the formed base part is the rectangular shape having rounded corners. Further, as illustrated in FIG. 8 as an example, a part between the adjacent two base parts becomes a cut-off section.

(8): The resist pattern is removed.

(9): The laminated body is stored into a chamber for heating, and is heated in a nitrogen atmosphere at a temperature in a range from 380° C. to 400° C. for three minutes. By doing this, on the surface of the base part, a native oxide film due to oxygen and moisture adhered to the surface of the base part or a small amount of oxygen and moisture in the chamber becomes a stable passivation film 115. The passivation film 115 includes an oxide of aluminum.

(10): A protection layer 111 made of SiN, SiON, or $SiO_2$ is formed using the CVD (Chemical Vapor Deposition) method.

(11): A window for p-side electrode contact is formed on the upper part of the mesa. In this case, after a mask is formed by the photoresist, the opening part above the mesa is exposed so that the photoresist of the part is removed. Then the protection layer 111 is etched by using buffered hydrofluoric acid (BHF) to form the window for the A-side electrode contact.

(12): A resist pattern having a square pattern with one side having a length of 10 μm is formed, so that p-side electrode material is evaporated. As the p-side electrode material, a multilayer film made of Cr/AuZn/Au or a multilayer film made of Ti/Pt/Au is used.

(13): The electrode material of the light emitting section is lifted off to form the p-side electrode 113.

(14): After polishing the rear side of the substrate 101 so as to have a predetermined thickness (for example, approximately 100 μm), the n-side electrode 114 is formed (see FIG. 11). In this case, the n-side electrode 114 is a multilayer film made of AuGe/Ni/Au.

(15): An annealing process is performed so as to have ohmic continuity between the p-side electrode 113 and the n-side electrode 114. By doing this the mesa becomes the light emitting section.

(16) The cut-off parts between adjacent two base parts are cut by performing a dicing process or a scribe breaking process.

After various post processes are performed, the surface emitting laser devices 100 are manufactured.

In this embodiment, the side wall (side surface) of the base part is passivated and further coated with a protection film (the protection layer 111). Namely, the base part is doubly protected against moisture and the like.

Figure 9:
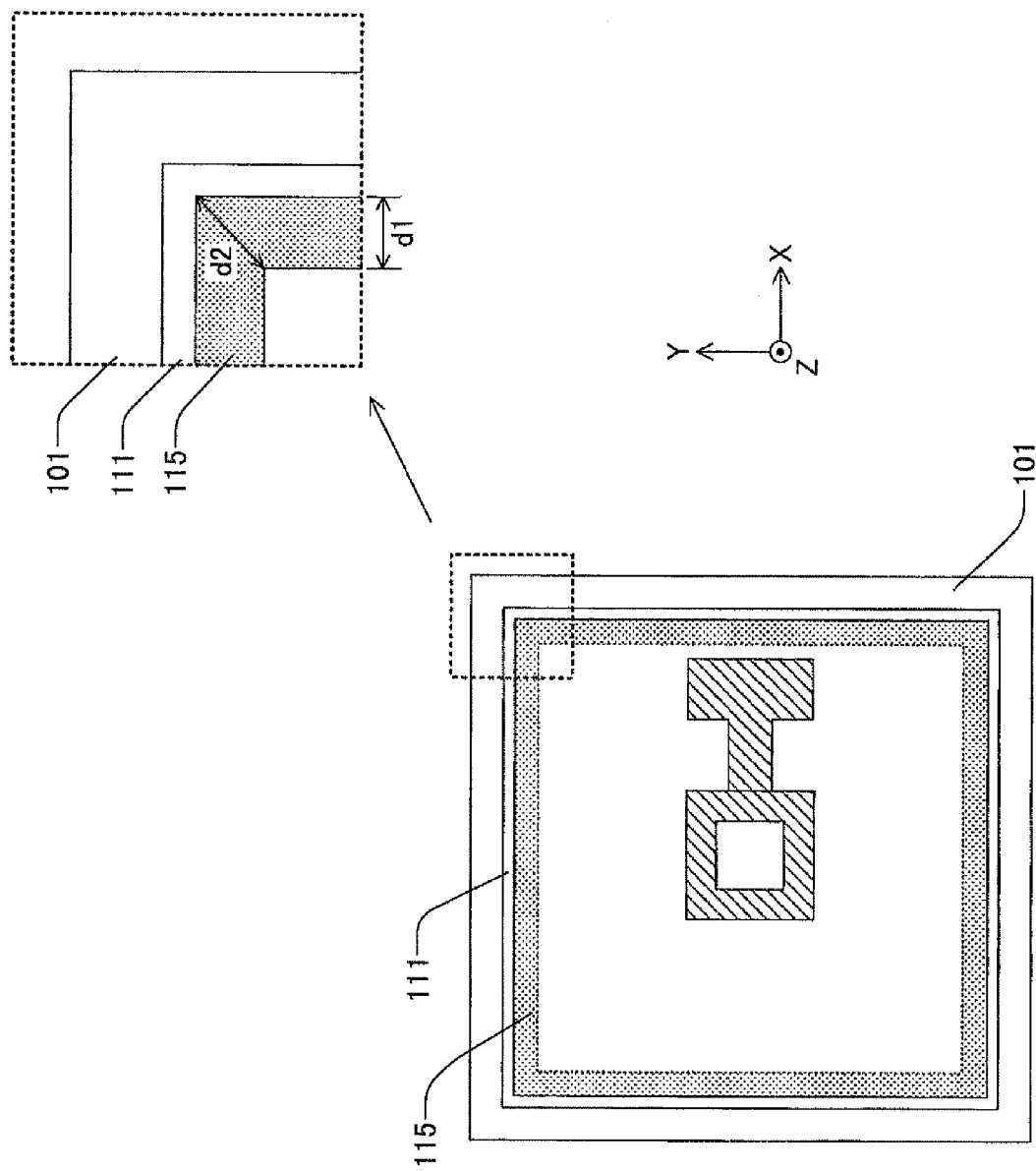
FIG. 9 is a drawing illustrating an outer shape of a base part of a surface emitting laser device of related art.

However, in this case, if the outer shape of the base part is a (simple) rectangular shape as illustrated in FIG. 9, the length (passivated distance or thickness) "d2" of the passivation film 115 at the four corners of the base part is approximately 1.4 times as long as the length (passivated distance or thickness) "d1" of the passivation film 115 at any other part. As a result, the passivation film 115 is distorted at the corners of the base part. Because of this feature, for example, in the process of adhering a photomask to the laminated body via a photoresist (e.g., the above process (11)) or cutting into pieces (e.g., the above process (16)) performed after the passivation film 115 has been formed, a crack may be easily generated at or in the vicinity of at least one of the four corners of the base part. Accordingly, the protection against moisture and the like may be degraded.

Figure 10:
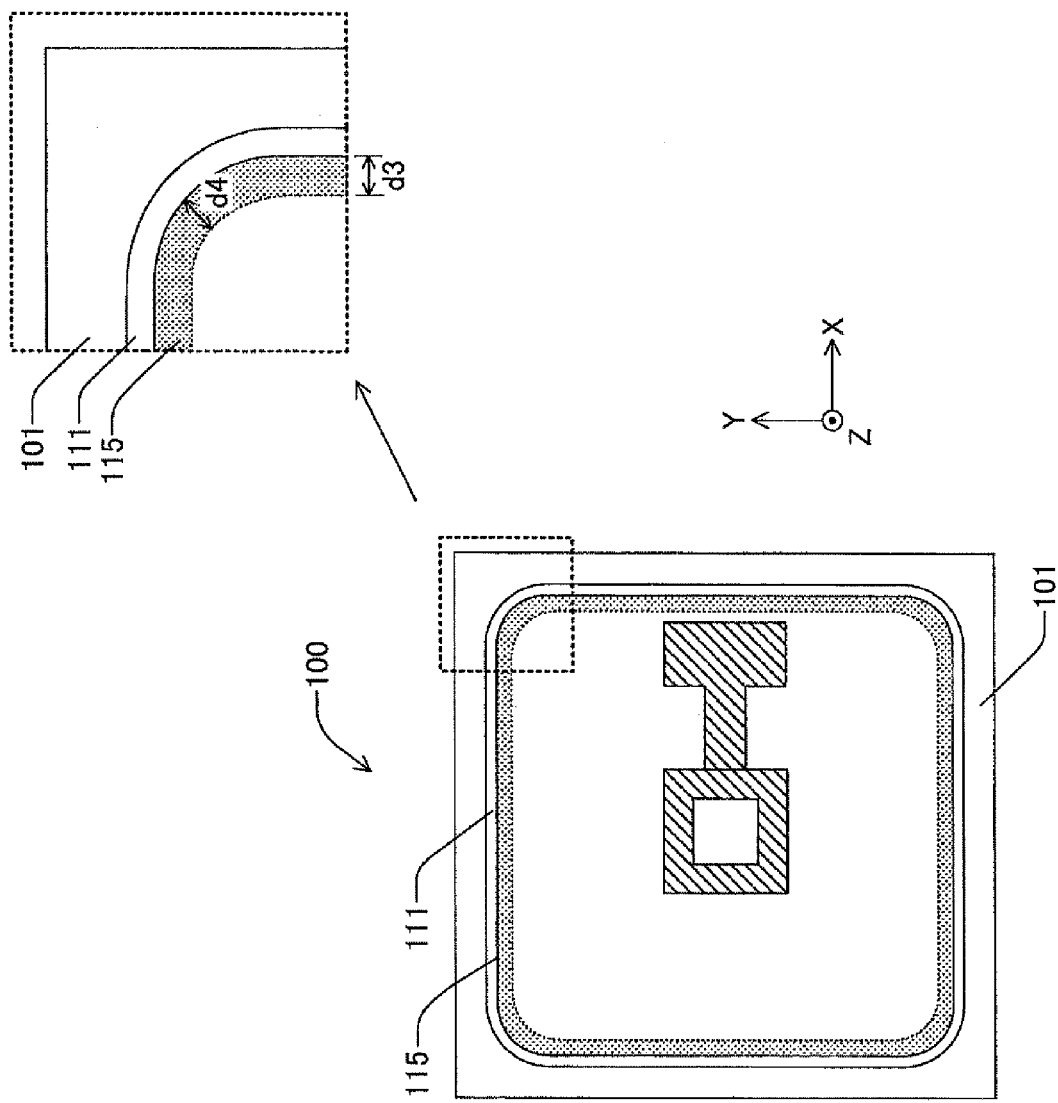
FIG. 10 is a drawing illustrating an outer shape of the base part of a surface emitting laser device according to an embodiment of the present invention.

On the other hand, according to this embodiment of the present invention, as described above, the outer shape of the base part is a rectangular shape having rounded (four) corners. Because of this feature, as illustrated in FIG. 10, the length (passivated distance or thickness) "d4" of the passivation film 115 at the four corners of the base part is substantially the same as the length (passivated distance or thickness) "d3" of the passivation film 115 at any other part. As a result, a crack is unlikely to be generated in the processes performed after the passivation film 115 is formed. Accordingly, it may become possible to better control the corrosion and remarkably improve the reliability when compared with related art.

Herein, the rectangular shape having rounded (four) corners refers to a curved shape but not a twisted curved shape. In this embodiment, the rectangular shape having rounded (four) corners refers to a shape where the length (passivated distance) of the passivation film 115 becomes constant at the corners (as illustrated in FIG. 10). Herein, this shape is referred to as a macroscopically smooth shape without an angular corner.

Three thousand surface emitting laser devices 100 manufactured based on the manufacturing method as described above were stored (exposed) in high temperature and high humidity atmosphere at a temperature of 85° C. and at a humidity of 85% for 500 hours. As a result, none of the surface emitting laser devices 100 was corroded.

As a comparative example, three thousand surface emitting laser devices in which the shape of the base part is a rectangular shape were manufactured and stored (exposed) in the same high temperature and high humidity atmosphere. As a result, in eight surface emitting laser devices, erosion was generated from the vicinity of the corner of the base part.

As apparent from the above description, in the manufacturing method of manufacturing the surface emitting laser devices 100, the manufacturing method of manufacturing the surface emitting laser devices according to the embodiment of the present invention is performed.

As described above, in the surface emitting laser device 100 according to this embodiment of the present invention, the resonant structure including the lower semiconductor DBR 103 and the active layer 105, the upper semiconductor DBR 107 and the like are laminated on the substrate 101.

Further, when viewed in the direction orthogonal to the surface of the substrate 101, the outer shape of the lower semiconductor DBR 103 is the macroscopically smooth shape without an angular corner. Further, an etching surface of the lower semiconductor DBR 103 is coated with the passivation film 115 and the protection layer 111.

Herein, the shape of the "macroscopically smooth shape without an angular corner" does not include an acute-angle corner and includes plural corners greater than 90 degrees or the curved shape but not a twisted curved shape. Herein, the shape of the corner is not the twisted curved shape means that there is no internally concave part at one corner. In other words, at one corner, the shape of the corner is the curved shape where each of the tangent lines corresponding to all the points on the curved shape at a corner contacts to only one point (and does not contact to any other points) on the curved shape at the corner.

In this case, it may become possible to prevent a crack from being generated into the passivation film 115 and improve the reliability when compared with related art.

Further, due to the improvement of the reliability of the surface emitting laser device 100, it may also become possible to improve the reliability of the optical scanning device 1010 and the laser printer 1000.

As a result, in the optical scanning device 1010, it may become possible to stably perform the optical scanning. Further, in the laser printer 1000, it may become possible to form higher quality image.

Figure 11:
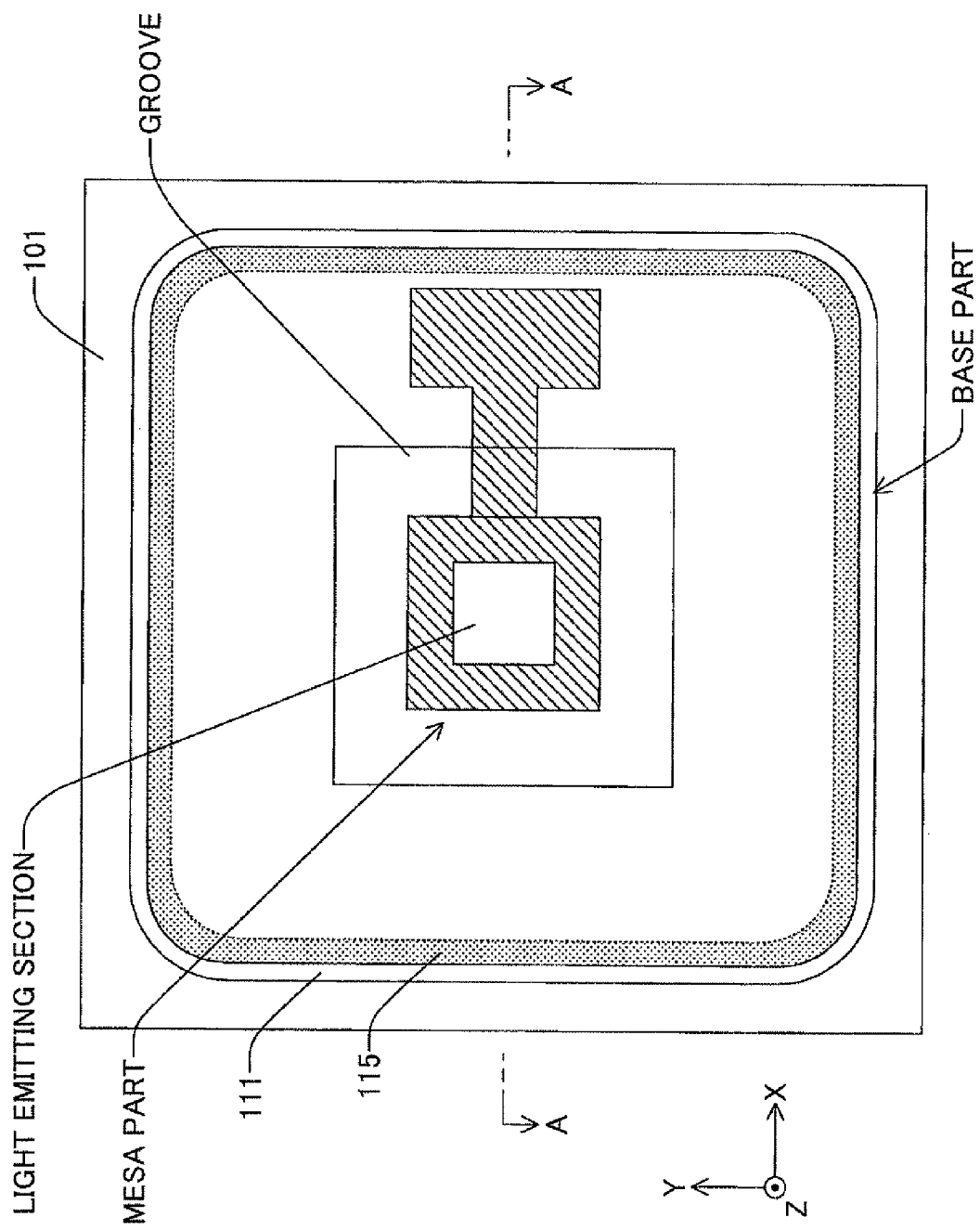
FIG. 11 is a drawing illustrating a first modified embodiment of the surface emitting laser device.
Figure 12:
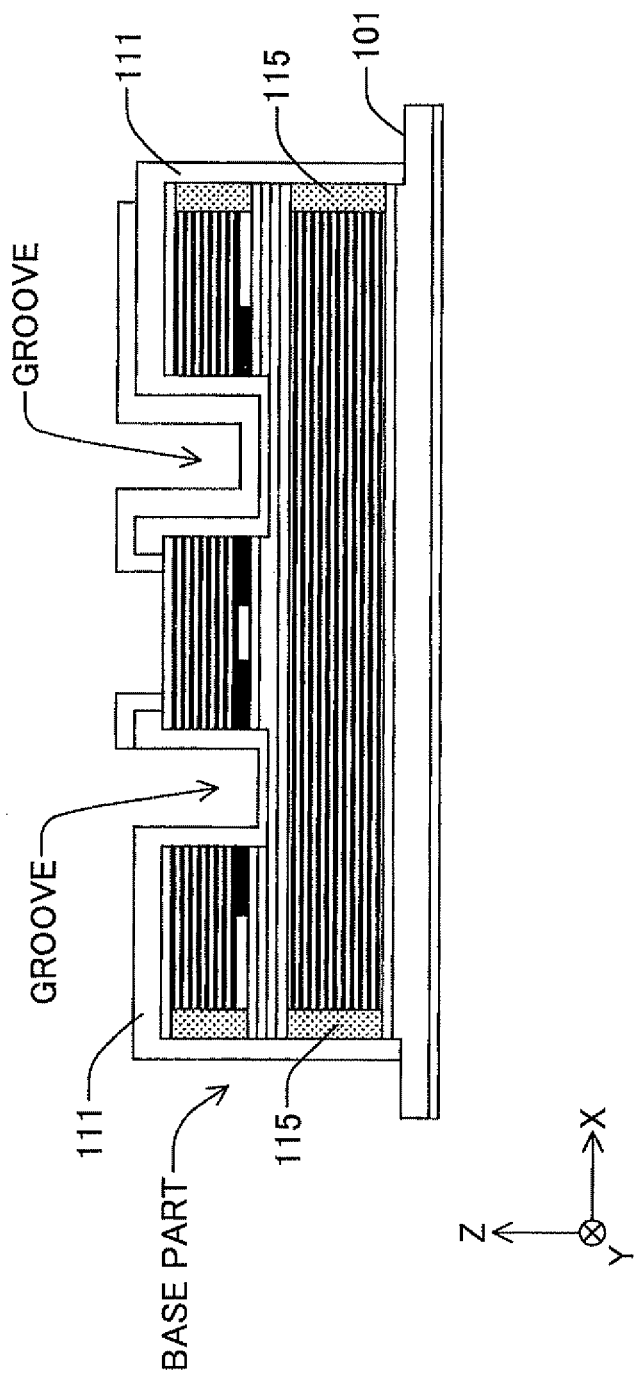
FIG. 12 is a cross-sectional view cut along the line A-A in FIG. 11.

On the other than, for example, as illustrated in FIG. 11 and FIG. 12 which is a cross-sectional view cut along the line A-A in FIG. 11, a groove structure may be formed on the circumference of the mesa. By doing this, an electrode pad may be disposed at the same height of the upper surface of the mesa. Therefore, when the a photomask is adhered to the laminated body via a photoresist, it may become possible to reduce the pressure applied to the light emitting section and reduce the parasitic capacitance due to the electrode pad. As a result, it may become possible to boost yield and improve the characteristics of the element.

Figure 13:
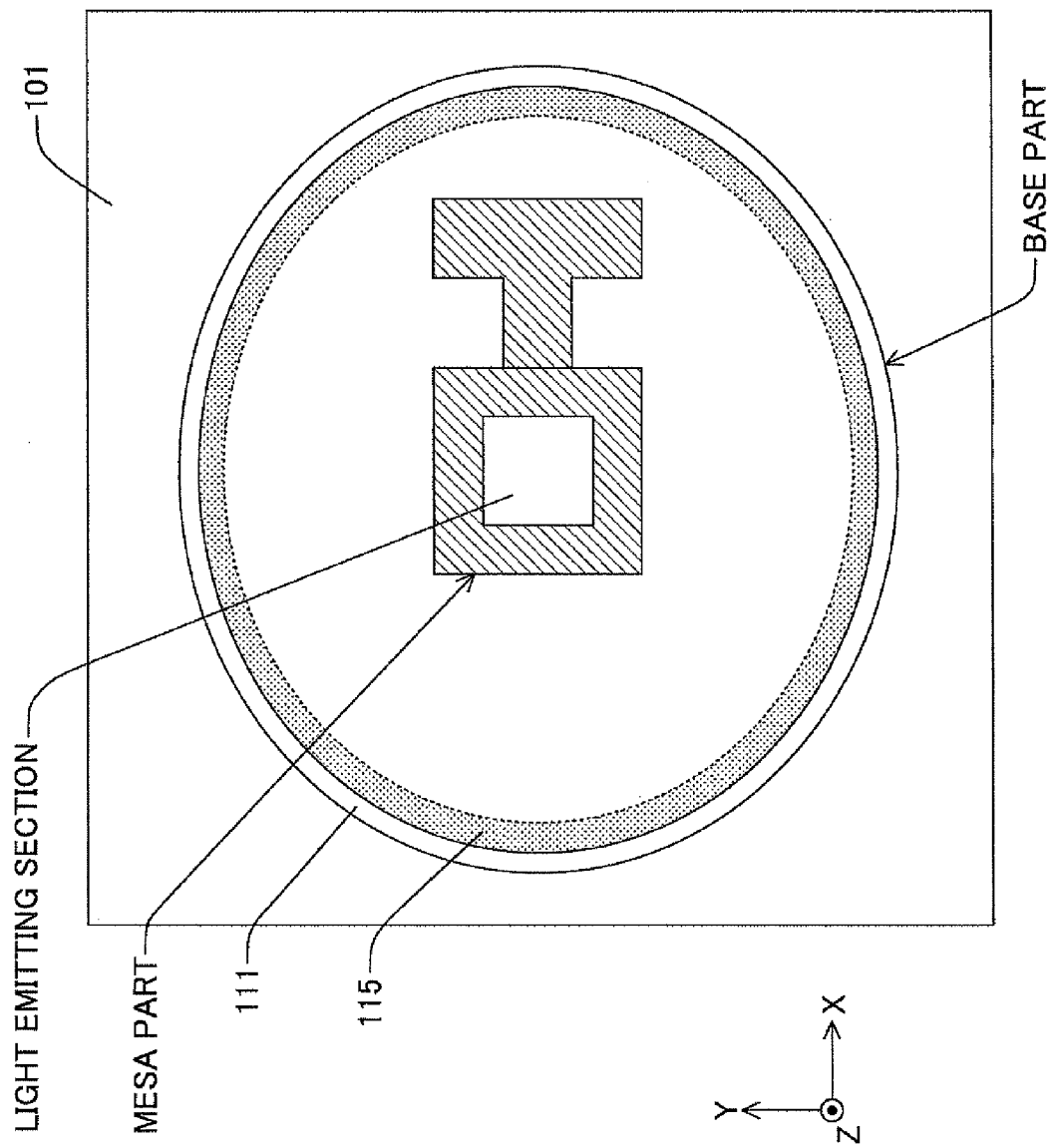
FIG. 13 is a drawing illustrating a second modified embodiment of the surface emitting laser device.
Figure 14:
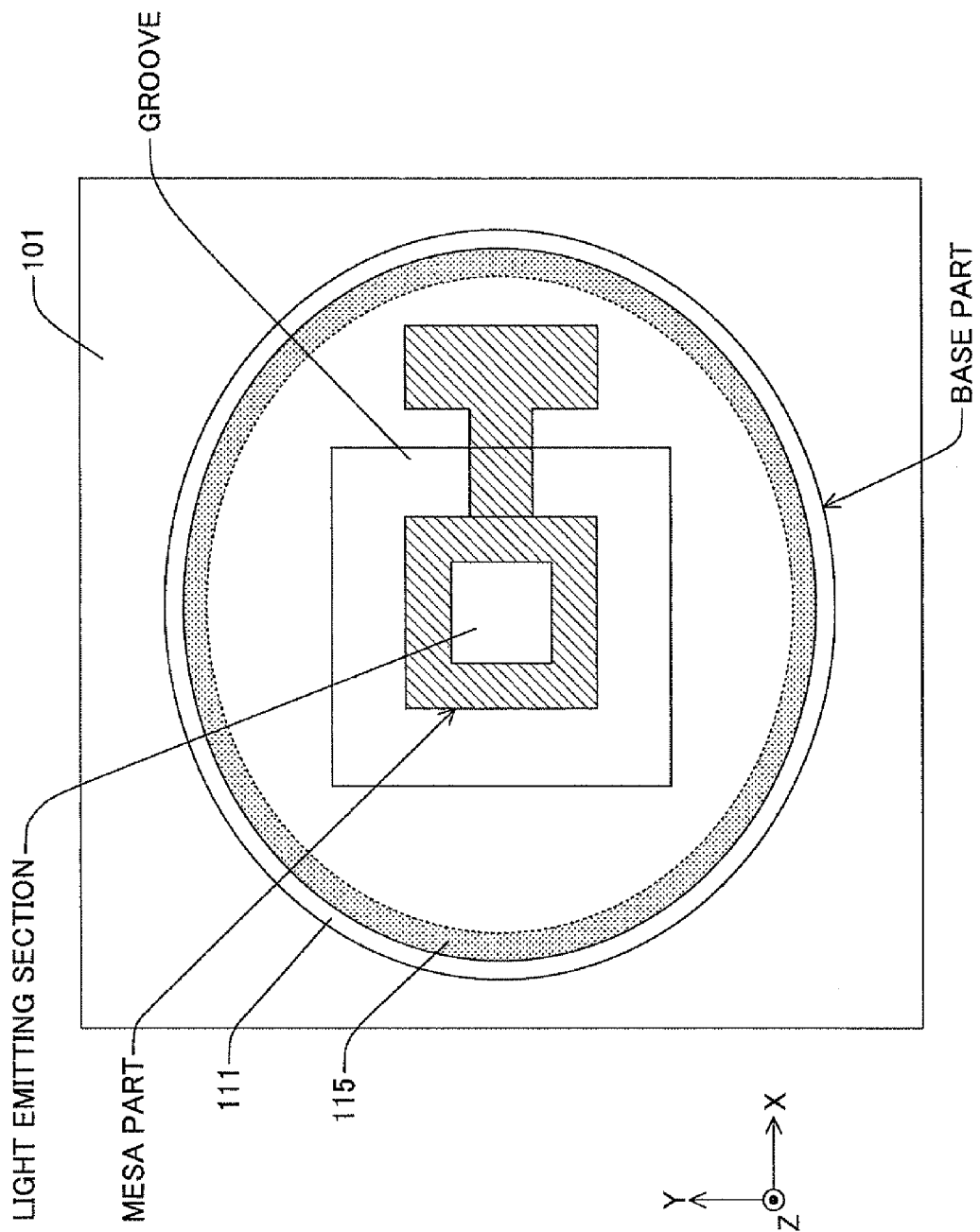
FIG. 14 is a drawing illustrating a third modified embodiment of the surface emitting laser device.
Figure 15:
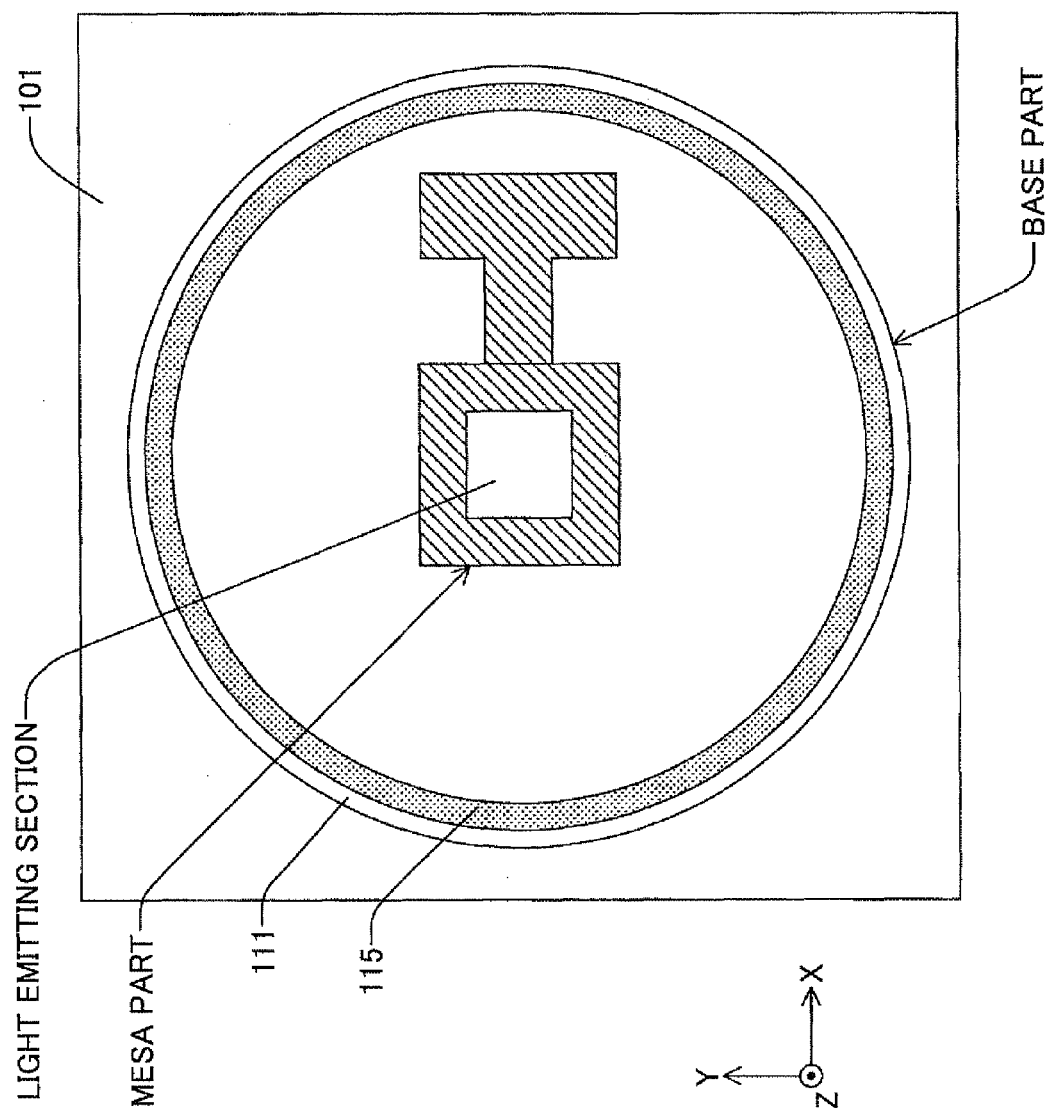
FIG. 15 is a drawing illustrating a fourth modified embodiment of the surface emitting laser device.
Figure 16:
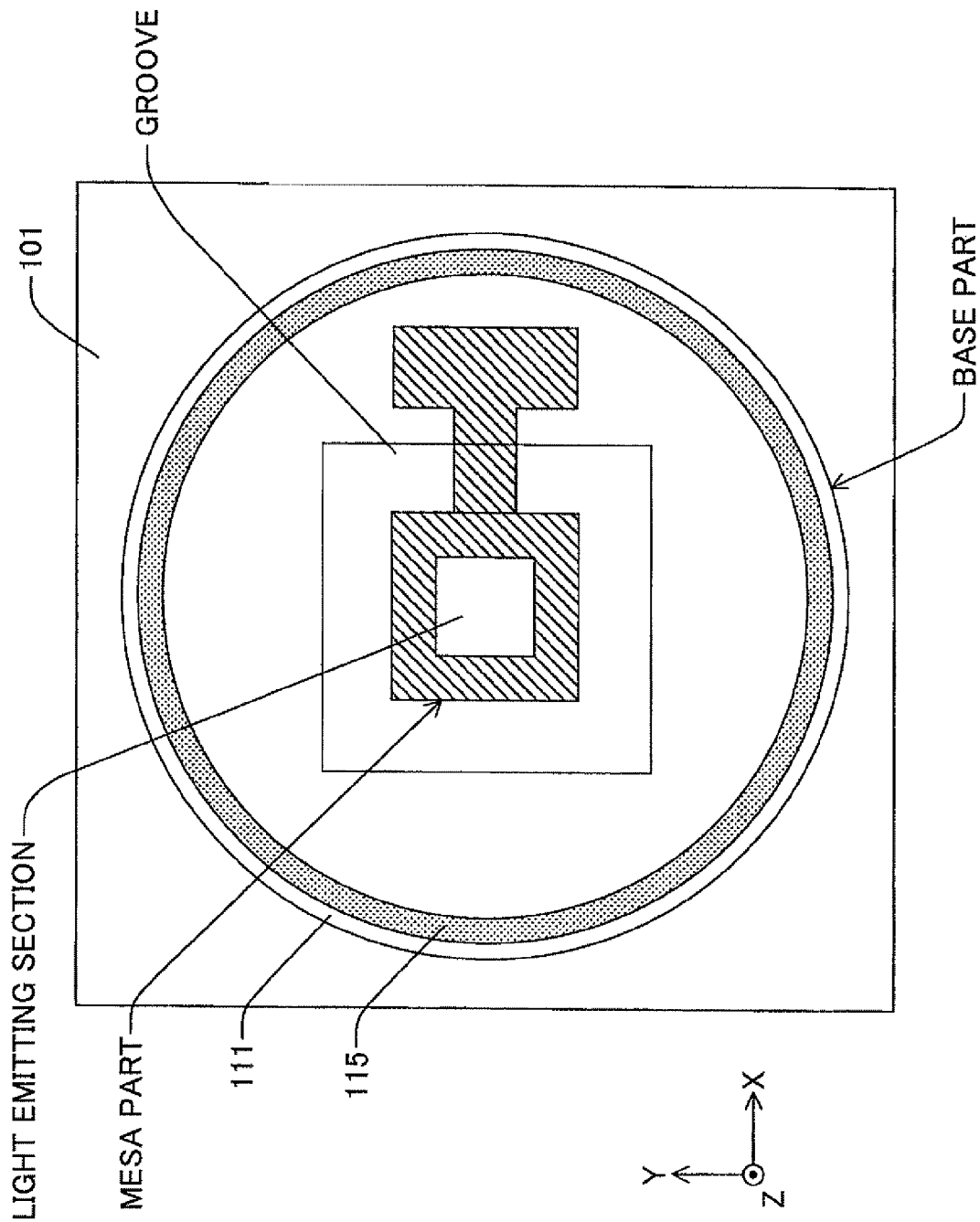
FIG. 16 is a drawing illustrating a fifth modified embodiment of the surface emitting laser device.

In the present invention, the outer shape of the base part is not limited to the rectangular shape having rounded corners. For example, as illustrated in FIGS. 13 and 14, the outer shape of the base part may be an ellipsoidal shape. Otherwise, for example, as illustrated in FIGS. 13 and 14, the outer shape of the base part may be a circular shape. In short, in this embodiment, the outer shape of the base part may be any shape where as long as the thickness (passivated distance) of the passivation film 115 can be substantially constant as schematically illustrated in FIG. 10. Further, FIGS. 13 and 15 illustrate the surface emitting laser devices where no groove is formed on the circumference of the mesa. On the other hand, FIGS. 14 and 16 illustrate the surface emitting laser devices where the groove (groove structure) is formed on the circumference of the mesa.

Further, in the present invention, the outer shape of the mesa, the shape of the p-side electrode, the shape of the groove on the circumference of the mesa are not limited to the respective shapes described above.

Figure 17:
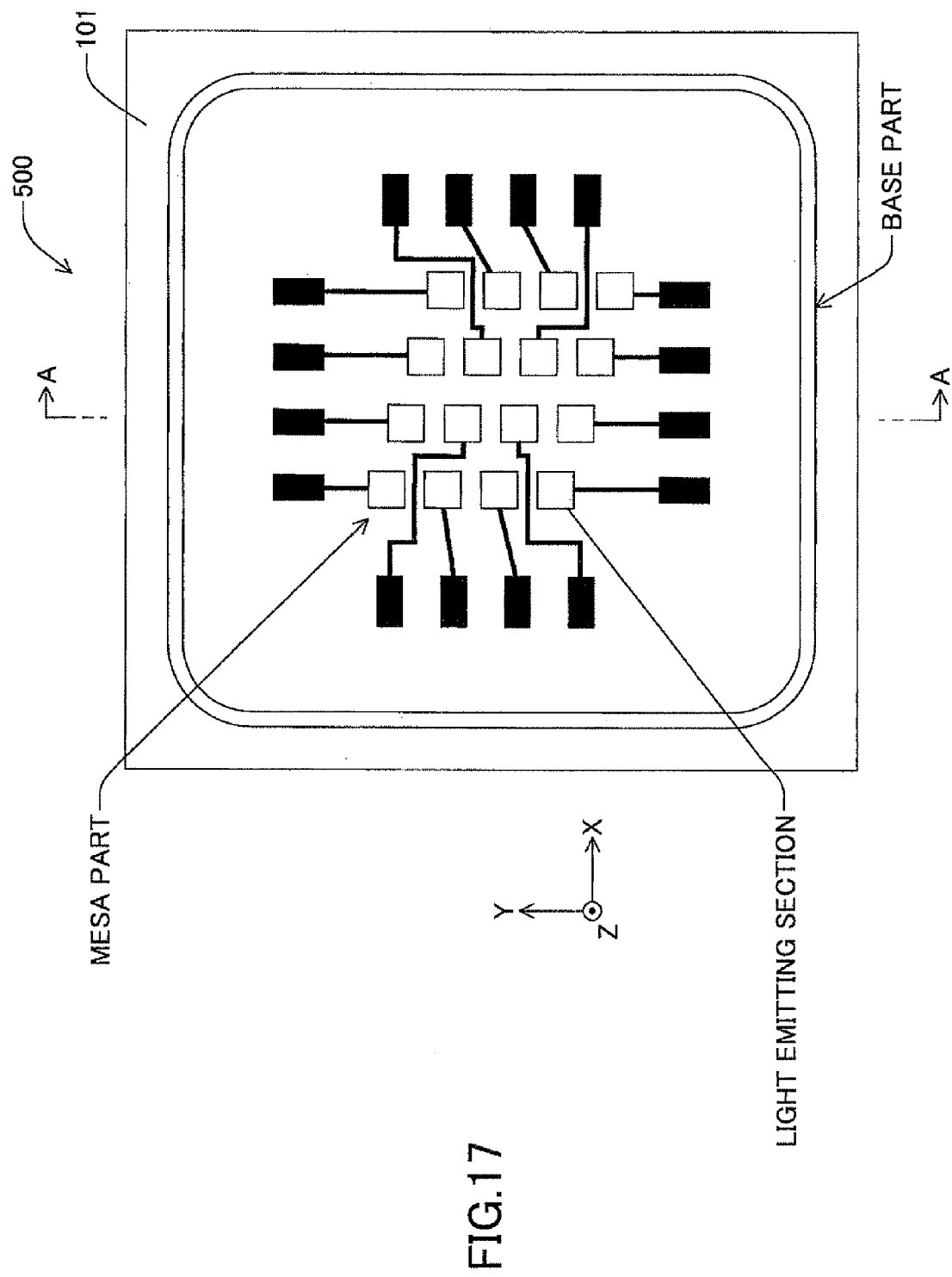
FIG. 17 is a drawing illustrating a surface emitting laser array.

Further, the light source 14 may include a surface emitting laser array 500 as exemplarily illustrated in FIG. 17 instead of using the surface emitting laser device 100.

The surface emitting laser array 500 includes plural (16 pieces in this case) light emitting sections two-dimensionally formed on the same substrate. In FIG. 17, the X axis direction corresponds to the main-scanning corresponding direction, and the Y axis direction corresponds to the sub-scanning corresponding direction. Further, in the present invention, the number of the light emitting sections is not necessarily limited to 16.

Figure 18:
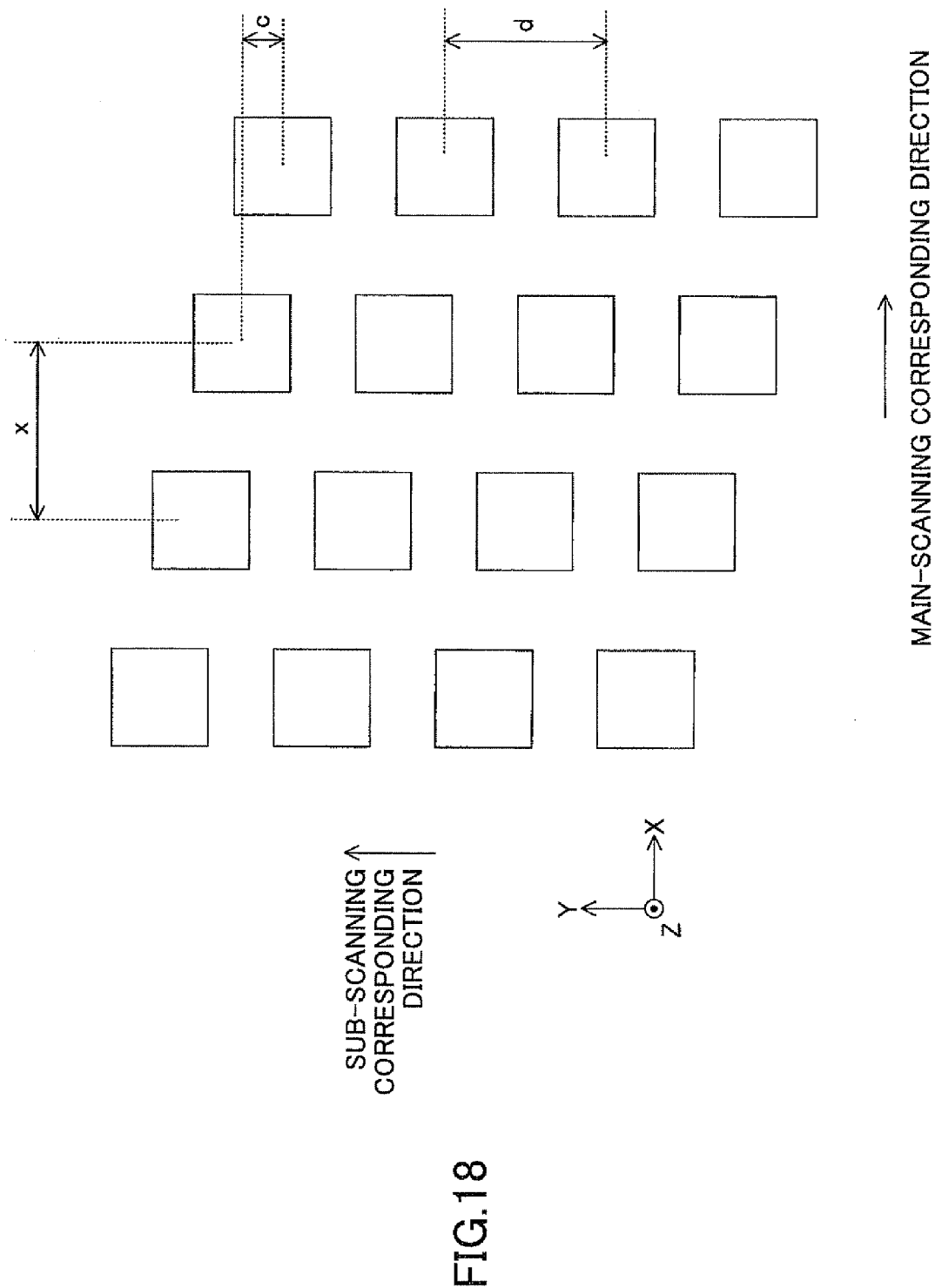
FIG. 18 is a drawing illustrating an arrangement of plural light emitting section in the surface emitting laser array.

As illustrated in FIG. 18, the plural (16 pieces in this case) light emitting sections are arrange in a manner such that when all the light emitting sections are orthographically projected on the virtual lines extending in the Y axis direction, the distance between the adjacent light emitting sections is equal to a constant distance c. Herein, the term "distance between the adjacent light emitting sections" refers to the distance between the centers of the adjacent two light emitting sections.

In this embodiment, the distance c is 6 μm, the distance d between the adjacent light emitting sections in the Y axis direction is 24 μm, and the distance x between the adjacent light emitting sections in the X axis direction is 30 μm.

Figure 19:
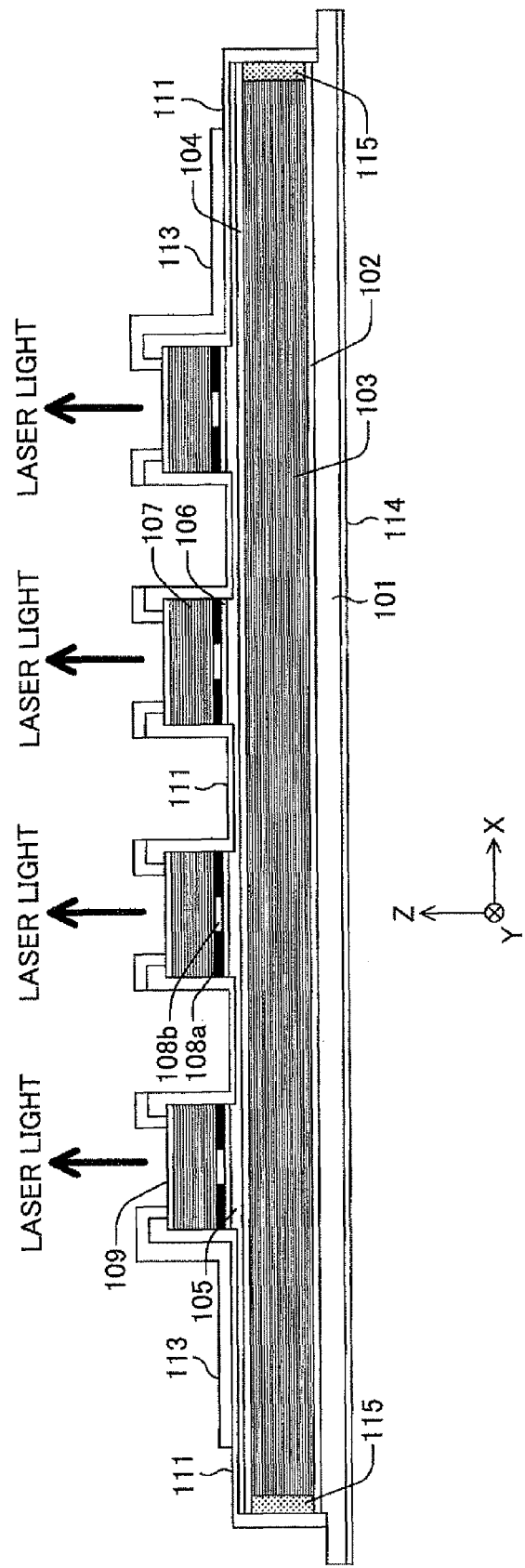
FIG. 19 is a cross-sectional view cut along the line A-A in FIG. 17.

As shown in FIG. 19 which is a cross-sectional view along the A-A line of FIG. 17, each of the light emitting sections has a similar configuration to that of the surface emitting laser 100. Namely, the surface emitting laser array 500 is a surface emitting laser array where plural surface emitting laser devices 100 are integrated. Therefore, the surface emitting laser array 500 may be manufactured in a similar manner to that in manufacturing the surface emitting laser 100. Therefore, in the surface emitting laser array 500, the similar effects to those of the surface emitting laser device 100 may also be obtained.

Three thousand surface emitting laser arrays 500 were stored (exposed) in high temperature and high humidity atmosphere at a temperature of 85° C. and at a humidity of 85% for 500 hours. As a result, none of the surface emitting laser arrays 500 was corroded.

As a comparative example, three thousand surface emitting laser arrays in which the outer shape of the base part is a rectangular shape were manufactured and stored (exposed) in the same high temperature and high humidity atmosphere. As a result, in several surface emitting laser arrays, erosion was generated from the vicinity of the corner of the base part.

As described above, the reliability of the surface emitting laser array 500 according to an embodiment of the present invention may be remarkably improved when compared with a conventional surface emitting laser array.

Further, in this case of the surface emitting laser array 500 as well, the outer shape of the base part may be an ellipsoidal shape, a circular shape or the like.

Three thousand surface emitting laser arrays in which the outer shape of the base part is an ellipsoidal shape were manufactured and stored (exposed) in the same high temperature and high humidity atmosphere. As a result, no erosion was detected. Similarly, three thousand surface emitting laser arrays in which the outer shape of the base part is a circular shape were manufactured and stored (exposed) in the same high temperature and high humidity atmosphere. As a result, no erosion was detected.

Figure 20:
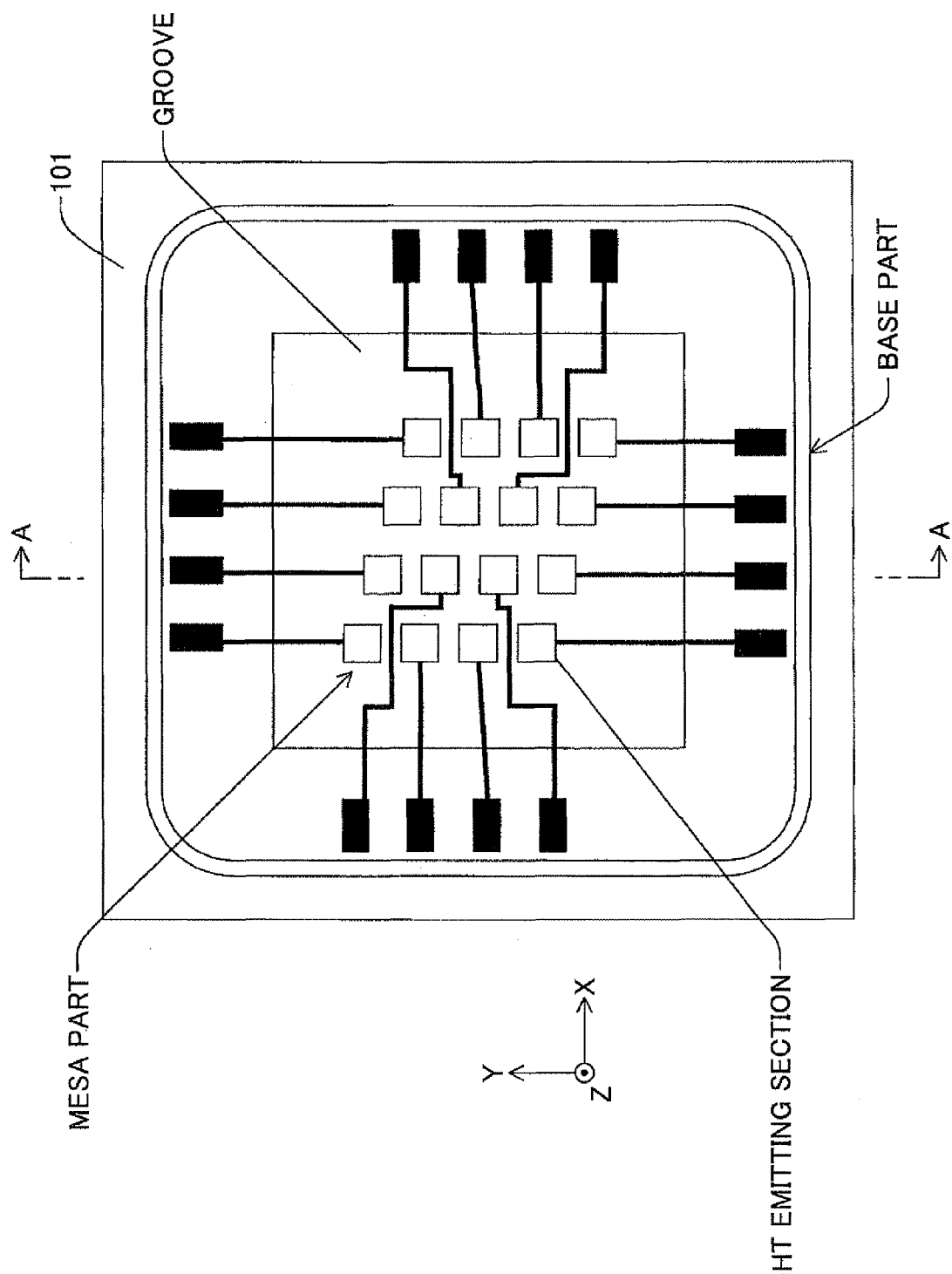
FIG. 20 is a drawing illustrating a modified embodiment of the surface emitting laser array.
Figure 21:
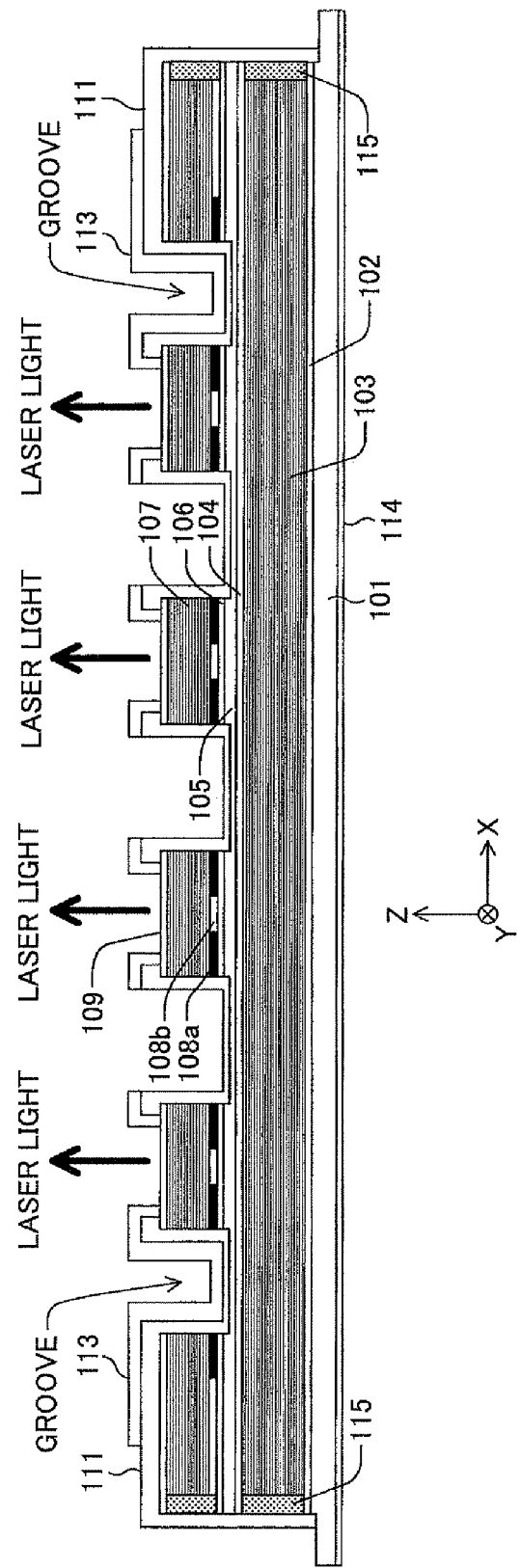
FIG. 21 is a cross-sectional view cut along the line A-A in FIG. 20.

Further, for example, as illustrated in FIG. 20 and FIG. 21 which is a cross-sectional view cut along the line A-A in FIG. 20, a groove may be formed on the circumference of the mesa.

Further, in the surface emitting laser array 500, when all the light emitting sections are orthographically projected on the virtual lines extending in the Y axis direction, the distance between the adjacent light emitting sections is equal to a constant distance c. Because of this configuration, by controlling the turn-on timings of the light emitting sections, the configuration of the surface emitting laser array 500 may be regarded as a configuration where the light emitting sections are arranged at regular intervals in the sub scanning direction on the photosensitive drum 1030.

Further, as described above, the distance c is 6 μm. Therefore, when the magnification of the optical system is set to approximately 1.8 times, high density writing of 2400 dpi (dots per inch) may be achieved. Obviously, for example, the density may be further enhanced by increasing the number of the light emitting sections in the main-scanning corresponding direction, by changing the array layout by reducing the distanced in the sub-scanning corresponding direction to further reduce the distance d, or by reducing magnification of the optical system. As a result, higher quality printing may be achieved. Further, the writing distance in the main scanning direction may be easily controlled by controlling the turn-on timings of the light emitting sections.

Further, in this case, even when the writing dot density is increased, the laser printer 1000 may perform printing without reducing the printing speed. Further, when assuming that writing dot density is to be maintained, the printing speed may be further increased.

On the other hand, preferably, the length (width) of the groove formed between adjacent two light emitting sections is equal to or greater than 5 μm to electrically and spatially separate the adjacent two light emitting sections. If the length (width) of the groove is too narrow, etching control may become difficult in manufacturing. Further, preferably, the size (i.e., one side) of the mesa is equal to or greater than 10 μm. If the size is too small, heat may not be sufficiently dissipated and as a result, the characteristics may be degraded.

Further, in the above embodiment, instead of using the surface emitting laser device 100, a surface emitting laser array that is manufactured in the same manner as the surface emitting laser device 100 and that includes the light emitting sections that are similar to those in the surface emitting laser devices 100 and that are one-dimensionally arranged may be used.

Further, in the above embodiment, a case is described where the normal direction of the main surface of the substrate 101 is inclined relative to the crystal orientation [100] direction toward the crystal orientation [111] A direction by an angle of 15 degrees ($\theta=15$ degrees) (see FIG. 6). However, the present invention is not limited to this configuration. For example, when the inclined substrate is used as the substrate 101, the normal direction of the main surface of the substrate 101 may be inclined relative to the minus direction of the crystal orientation <100> toward the minus direction of the crystal orientation <111>.

Further, in the above embodiment, a case is described where the substrate 101 is the inclined substrate. However, the present invention is not limited to this configuration.

Further, in the above embodiment, a case is described where the oscillation wavelength of the light emitting section is 780 nm band. However, the present invention is not limited to this configuration. The oscillation wavelength may be changed in accordance with the characteristics of the photosensitive body.

Further, the above-described surface emitting lasers may also be used in applications other than an image forming apparatus. In such a case, the oscillation wavelength may be, for example, 650 nm band, 850 nm band, 980 nm band, 1.3 µm band, 1.5 µm band or the like in accordance with the applications.

Further, in the above embodiment, a case is described where the mage forming apparatus is the laser printer 1000. However, the present invention is not limited to this configuration. In short, the present invention may also be applied to an image forming apparatus that includes the optical scanning device 1010.

Further, the image forming apparatus may include an image forming apparatus directly irradiating laser light on a medium (e.g., a sheet) that is colored based on the irradiated laser light.

For example, the medium may be a printing plate known as CTP (Computer to Plate). Namely, the optical scanning device 1010 may be applied to an image forming apparatus that directly forms an image on the printing plate material by laser ablation to form a printing plate.

For example, the medium may be so-called rewritable paper. In such a rewritable paper, as a recording layer, a material described below is applied on a supporting body made of, for example, paper or a resin film. Then, by controlling thermal energy of the laser light, the coloring/discoloring operations may be reversibly performed on the medium.

There exists a transparent-opaque type rewritable marking method and a coloring/discoloring type rewritable marking method using leuco dye. The present invention may be applied to any of those methods.

In the transparent-opaque type rewritable marking method, molecules of fatty acid are dispersed in a polymer thin film. When heated at a temperature equal to or higher than 110° C., resin expands due to melting of the fatty acid. After that, when cooled, the fatty acid is in a supercooled condition and remains in liquid form, and the expanded resin is solidified. After that, the fatty acid is solidified and shrinks to become polycrystalline molecules, thereby generating air gaps between resin and molecules. Due to the air gaps, light is scattered and white color is present. Next, when heated at a delete temperature range from 80° C. to 110° C., the fatty acid is partially melted and the resin thermally expands to fill the air gaps. Under this condition, when cooled, the transparent status appears and as a result, the image is deleted.

In the rewritable marking method using leuco dye, a reversible coloring/discoloring reaction is used based on a colorless leuco-type dye and a developing-decoloring agent having a long-chain alkyl group. In this method, when heated due to the laser light, the leuco dye and the developing-decoloring agent are reacted together to develop color. Then, when rapidly cooled, the developed color status is maintained. After that, when heated and then gradually cooled, due to the self-aggregation activity of the long-chain alkyl group of the developing-decoloring agent, the phase separation occurs. Namely, the leuco dye and the developing-decoloring agent are physically separated and as a result, the color disappears.

Further, the medium may be so-called color rewritable paper in which photochromic compounds are applied (provided) on the supporting body made of paper, resin film or the like. The photochromic compounds includes a photochromic compound which develops cyan (C) color upon receiving an ultraviolet light and deletes the color upon receiving R (red) visible light, a photochromic compound which develops magenta (M) color upon receiving an ultraviolet light and deletes the color upon receiving G (green) visible light, and a photochromic compound which develops yellow (Y) color upon receiving an ultraviolet light and deletes the color upon receiving B (blue) visible light.

In the use of the medium, first, an ultraviolet light is irradiated to develop deep black color once, and the irradiation time periods and the intensities of the RGB lights are adjusted to control color optical densities of the three types of materials which develop YMC colors to display full colors. In this case, when high-intensity RGB lights are irradiated, the three types of YMC colors may be deleted to generate pure white color.

An apparatus capable of controlling light energy to use a medium having the reversible coloring/discoloring function as described above may also be achieved as the image forming apparatus having the light scanning device as described in the above embodiment.

Further, for example, the present invention may also be applied to an image forming apparatus using a silver-salt film as an image carrier. In this case, a latent image is formed on the silver-salt film by optical scanning, and the latent image may be visualized by a process similar to a developing process performed in a typical silver salt photographic process. Then, the image may be transferred to a printing paper by performing a process similar to the printing process in the typical silver salt photographic process. Such an image forming apparatus may include an optical photoengraving apparatus and an optical drawing apparatus capable of drawing a CT scan image and the like.

Figure 22:
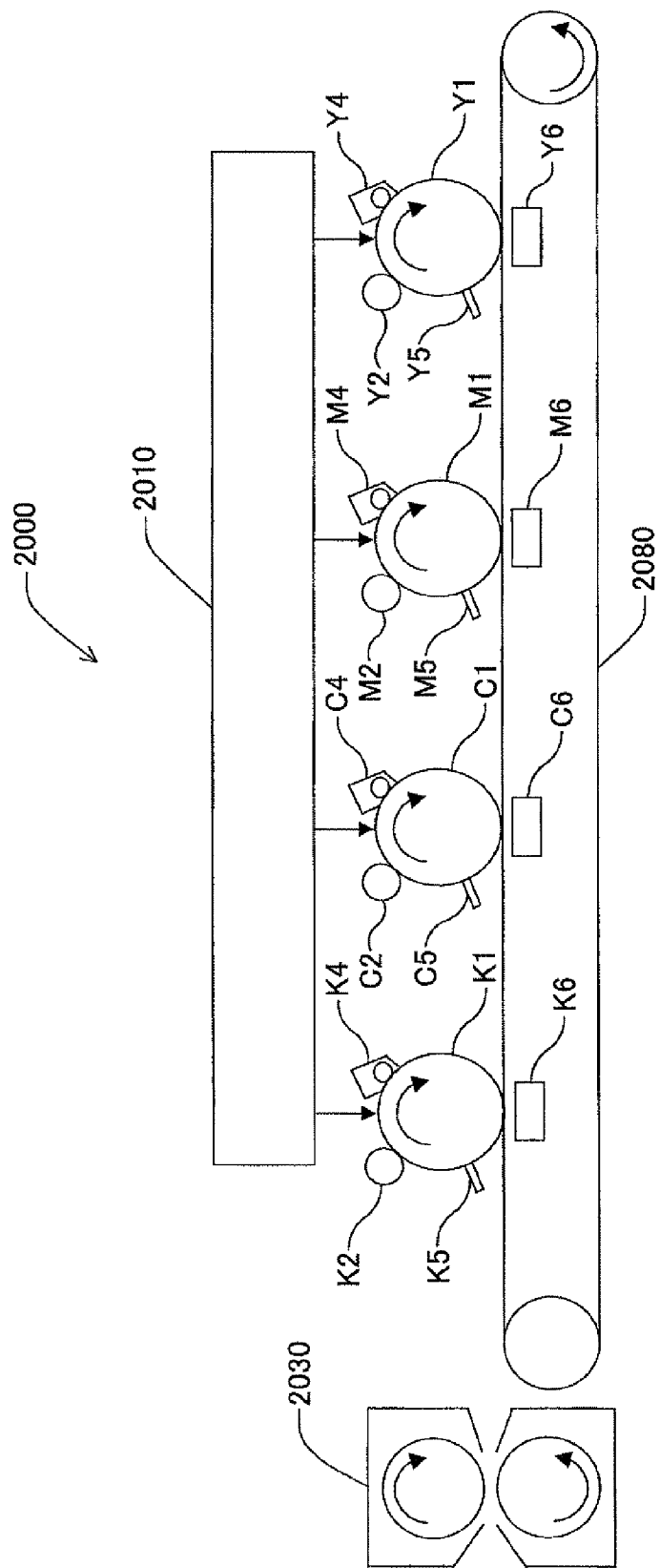
FIG. 22 is a schematic drawing illustrating a configuration of a color printer.

Further, as shown in FIG. 22 as an example, the image forming apparatus may be a color printer 2000 having plural photosensitive drums.

The color printer 2000 is a tandem-type multi-color printer forming a full-color image by combining four colors (black, cyan, magenta, and yellow). The color printer 2000 includes a station for black (K) (having a photosensitive drum K1, a charger K2, a developing device K4, a cleaning unit K5, and a transfer device K6), a station for cyan (C) (having a photosensitive drum C1, a charger C2, a developing device C4, a cleaning unit C5, and a transfer device C6), a station for magenta (M) (having a photosensitive drum M1, a charger M2, a developing device M4, a cleaning unit M5, and a transfer device M6), a station for yellow (Y) (having a photosensitive drum Y1, a charger Y2, a developing device Y4, a cleaning unit Y5, and a transfer device Y6), and an optical scanning device 2010, a transfer belt 2080, a fixing unit 2030 and the like.

The photosensitive drums rotate in the respective arrow directions shown in FIG. 22. In the vicinity of each photosensitive drum, along the rotating direction, the charger, the developing device, the transfer device, and the cleaning unit are disposed in this order. The chargers uniformly charge the surface of the respective photosensitive drums. The optical scanning device 2010 irradiates light onto the surfaces of the photosensitive drums to form latent images on the respective photosensitive drums, the surfaces having been charged by the respective chargers. Then, colored toner images are formed on the surfaces of the photosensitive drums by the respective developing devices. Further, the colored toner images are superposed onto the recording paper on the transfer belt 2080 by the respective transfer devices. Finally, the superposed colored image is fixed to the recording paper by the fixing unit 2030.

The optical scanning device 2010 includes light sources similar to the light sources 14. Therefore, it may be possible for the optical scanning device 2010 to obtain the same effects as those in the optical scanning device 1010. Further, the color printer 2000 includes the optical scanning device 2010. Therefore, it may be possible for the color printer 2000 to obtain the same effects as those in the laser printer 1000.

Further, in the color printer 2000, a color displacement may occur due to a manufacturing error, a positional error or the like of the parts used in the color printer 2000. Even in such a case, when the light sources of the optical scanning device 2010 include the surface emitting laser array similar to the surface emitting laser array 500, the color displacement may be better controlled by appropriately selecting the light emitting sections to be turned ON.

Further, in the above embodiment, when it is not necessary to consider the heat dissipation, the lower semiconductor DBR 103 may consist of the low refractive index layers made of n-AlAs and having an optical film thickness of λ/4.

Further, in the above embodiment, when it is not necessary to consider the heat dissipation, the lower semiconductor DBR 103 may consist of the low refractive index layers made of n-$Al_{0.93}Ga_{0.07}As$ and having an optical film thickness of λ/4.

As described above, in the surface emitting laser device according to an embodiment of the present invention and the surface emitting laser array according to an embodiment of the present invention, it may become possible to improve the reliability. Further, in the optical scanning device according to an embodiment of the present invention, it may become possible to stably perform the optical scanning. Further, in the image forming apparatus according to an embodiment of the present invention, it may become possible to form higher-quality images. Further, in the method of manufacturing the surface emitting laser devices according to an embodiment of the present invention, it may become possible to manufacture the surface emitting laser devices having higher reliability.

According to an embodiment of the present invention, a surface emitting laser device includes a substrate and plural semiconductor layers laminated on the substrate, the plural semiconductor layers including a first semiconductor multi-layer film including aluminum (Al), an active layer, and a second semiconductor multi-layer film, a light emitting section having a mesa structure being formed on the first semiconductor multi-layer film. Further, when viewed in a direction orthogonal to a surface of the substrate, an outer shape of the first semiconductor multi-layer film is a macroscopically smooth shape without an angular corner, and a side surface of the first semiconductor multi-layer film is coated with a passivation film and a protection film.

Herein, the "macroscopically smooth shape without an angular corner" does not include an acute-angle corner and includes plural corners greater than 90 degrees or the curved shape but not a twisted curved shape.

By having this structure, it may become possible to improve the reliability.

Further, the passivation film may include the oxide of aluminum.

Further, a groove may be formed on the circumference of the light emitting section.

Further, when viewed in the direction orthogonal to the surface of the substrate, the outer shape of the first semiconductor multi-layer film may be any one of the rectangular shape having rounded corners, the ellipsoidal shape, and the circular shape.

Further, the first semiconductor multi-layer film may include the AlAs layer.

Further, in the first semiconductor multi-layer film, the optical thickness of the low refractive index layer near the active layer is greater than "(oscillation wavelength)/4".

Further, in the first semiconductor multi-layer film, within a range of layers having five low refractive index layers closer to the active layer than any other low refractive index layers, there is the low refractive index layer having the optical thickness greater than "(oscillation wavelength)/4".

Further, the resonant structure including the active layer and spacer layers sandwiching the active layer includes the layer including indium (In).

Further, the layer including indium (In) is the AlGaInP layer.

According to an embodiment of the present invention, there is provided a surface emitting laser array in which the surface emitting laser devices according to an embodiment of the present invention are integrated.

By having this configuration, due to the integrated surface emitting laser devices according to an embodiment of the present invention, it may become possible to improve the reliability of the surface emitting laser array.

According to an embodiment of the present invention, there is provided an optical scanning device scanning a surface to be scanned using light. The optical scanning device includes a light source including the surface emitting laser device according to an embodiment of the present invention, a deflector that deflects the light from the light source, and a scanning optical system that focuses the light deflected by the deflector onto a surface to be scanned.

By having this configuration, due to the surface emitting laser device according to an embodiment of the present invention, it may become possible to improve the reliability of the optical scanning device.

According to an embodiment of the present invention, there is provided an optical scanning device scanning a surface to be scanned using light. The optical scanning device includes a light source including the surface emitting laser array according to an embodiment of the present invention, a deflector that deflects the light from the light source, and a scanning optical system that focuses the light deflected by the deflector onto a surface to be scanned.

By having this configuration, due to the surface emitting laser array according to an embodiment of the present invention, it may become possible to improve the reliability of the optical scanning device.

According to an embodiment of the present invention, there is provided an image forming apparatus including an image carrier and the optical scanning device according to an embodiment of the present invention that scans the light onto the image carrier, the light being modulated based on image information.

By having this configuration, due to the optical scanning device according to an embodiment of the present invention, as a result, it may become possible to form higher-quality images.

Further, the image information may be multi-colored.

According to an embodiment of the present invention, there is provided a method of manufacturing a surface emitting laser device including a substrate and plural semiconductor layers laminated on the substrate, the plural semiconductor layers including a first semiconductor multi-layer film including aluminum (Al), an active layer, and a second semiconductor multi-layer film, a light emitting section having a mesa structure being formed on the first semiconductor multi-layer film. The method includes a step of etching the first semiconductor multi-layer film in a manner such that when viewed in a direction orthogonal to a surface of the substrate, an outer shape of the first semiconductor multi-layer film is a macroscopically smooth shape without an angular corner, a step of passivating the etched surface of the first semiconductor multi-layer film, and a step of coating the passivated surface with a protection film.

By using this method, it may become possible to manufacture the surface emitting laser devices having higher reliability.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser device comprising:
a substrate:
a first semiconductor multi-layer film including aluminum (Al);
an active layer;
a second semiconductor multi-layer film; and
a mesa structure formed on the first semiconductor multi-layer film and including at least a part of the second semiconductor multi-layer film,
wherein when viewed in a direction orthogonal to a surface of the substrate, an outer shape of the first semiconductor multi-layer film is a smooth shape without an angular corner, and a side surface of the first semiconductor multi-layer film is coated with a passivation film and protection film.

2. The surface emitting laser device according to claim 1, wherein the passivation film includes an oxide of aluminum.

3. The surface emitting laser device according to claim 1, wherein a groove is formed on a circumference of the mesa structure.

4. The surface emitting laser device according to claim 1, wherein when viewed in the direction orthogonal to the surface of the substrate, the outer shape of the first semiconductor multi-Layer film is any one of a rectangular shape having rounded corners, an ellipsoidal shape, and a circular shape.

5. The surface emitting laser device according to claim 1, wherein the first semiconductor multi-layer film includes at least an AlAs layer.

6. The surface emitting laser device according to claim 5, a resonant structure including the active layer and spacer layers sandwiching the active layer includes a layer including indium (In).

7. The surface emitting laser device according to claim 6, wherein the layer including indium (In) is an AlGaInP layer.

8. The surface emitting laser device according to claim 1, wherein the first semiconductor multi-layer film includes at least a low refractive index Layer of which the optical thickness is greater than "(oscillation wavelength)/4".

9. The surface emitting laser device according to claim 8, wherein, in the first semiconductor multi-layer film, within a range of layers having five low refractive index layers closer to the active layer than any other low refractive index layers, there is the low refractive index layer having the optical thickness greater than "(oscillation wave length)/4".

10. A surface emitting laser array in which the surface emitting laser device, according to claim 1 are integrated.

11. An optical scanning device scanning a surface to be scanned using light, the optical scanning device comprising:
a light source including the surface emitting laser array according to claim 10;
a deflector that deflects the light from the light source; and
a scanning optical system that focuses the light deflected by the deflector onto a surface to be scanned.

12. An optical scanning device scanning a surface to be scanned using light, the optical scanning device comprising;
a light source including the surface emitting laser array according to claim 1;
a deflector that deflects the light from the light source; and
a scanning optical system that focuses the light deflected by the deflector onto a surface to be scanned.

13. An image forming apparatus comprising:
an image carrier; and
the optical scanning device according to claim 12 that scans the light onto the image carrier, the light being modulated based on image information.

14. The image forming apparatus according to claim 13, wherein the image information is multi-colored.

15. The surface emitting laser device according to claim 1, wherein when viewed in the direction orthogonal to the surface of the substrate, the smooth outer shape of the first semiconductor multi-layer film without the angular corner is circumscribed by the passivation film.

* * * * *